(12) United States Patent
Kim et al.

(10) Patent No.: US 11,824,045 B2
(45) Date of Patent: Nov. 21, 2023

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventors: Junghwan Kim, Hwaseong-si (KR); Sangcheon Park, Hwaseong-si (KR)

(73) Assignee: Samsung Electronics Co., Ltd.

( * ) Notice: Subject to any disclaimer, the term of this patent is extended or adjusted under 35 U.S.C. 154(b) by 127 days.

(21) Appl. No.: 17/469,954

(22) Filed: Sep. 9, 2021

(65) Prior Publication Data

US 2022/0181299 A1    Jun. 9, 2022

(30) Foreign Application Priority Data

Dec. 8, 2020 (KR) .......................... 10-2020-0170458

(51) Int. Cl.
   *H01L 25/065* (2023.01)
   *H01L 23/00* (2006.01)
   *H01L 29/06* (2006.01)

(52) U.S. Cl.
   CPC .......... *H01L 25/0657* (2013.01); *H01L 24/08* (2013.01); *H01L 29/0684* (2013.01); *H01L 2224/08146* (2013.01)

(58) Field of Classification Search
   CPC .. H01L 25/0657; H01L 24/08; H01L 29/0684
   See application file for complete search history.

(56) References Cited

U.S. PATENT DOCUMENTS

| | | | |
|---|---|---|---|
| 7,820,484 B2 | 10/2010 | Chua et al. | |
| 8,901,727 B2 | 12/2014 | Kang et al. | |
| 8,987,057 B2 | 3/2015 | Van Gemert et al. | |
| 9,397,000 B2 | 7/2016 | Priewasser | |
| 9,892,989 B1 | 2/2018 | Ho et al. | |
| 10,720,495 B2 | 7/2020 | Yu et al. | |
| 2002/0030262 A1* | 3/2002 | Akram ................ | H01L 23/3185 257/E25.011 |
| 2002/0030263 A1* | 3/2002 | Akram .................... | H01L 25/18 257/E25.011 |

(Continued)

FOREIGN PATENT DOCUMENTS

KR    1020140042090 A    4/2014

*Primary Examiner* — Nathan W Ha
(74) *Attorney, Agent, or Firm* — Fish & Richardson P.C.

(57) ABSTRACT

A semiconductor package includes a first, second, third and fourth semiconductor chips sequentially stacked on one another. The second semiconductor chip includes a second substrate and a second substrate recess formed in an edge of a backside surface of the second substrate. The third semiconductor chip includes a third substrate and a first metal residual material provided in a peripheral region of a front surface of the third substrate. When the second semiconductor chip and the third semiconductor chip are bonded to each other such that the front surface of the third substrate and the backside surface of the second substrate face each other, the first metal residual material is located in the second substrate recess. A first bonding pad on the backside surface of the second substrate and a second bonding pad on the front surface of the third substrate are bonded to each other.

19 Claims, 18 Drawing Sheets

(56) References Cited

U.S. PATENT DOCUMENTS

| | | | |
|---|---|---|---|
| 2007/0278648 A1* | 12/2007 | Akram | H01L 25/0657 |
| | | | 438/109 |
| 2009/0108430 A1* | 4/2009 | Chung | H01L 25/105 |
| | | | 257/E23.169 |
| 2012/0136611 A1* | 5/2012 | Kim | G01R 31/318513 |
| | | | 702/118 |
| 2012/0170345 A1* | 7/2012 | Choi | H01L 25/0657 |
| | | | 438/109 |
| 2013/0157414 A1* | 6/2013 | Ho | H01L 25/50 |
| | | | 257/E21.599 |
| 2017/0365584 A1* | 12/2017 | Vadhavkar | H01L 25/0657 |
| 2018/0145060 A1* | 5/2018 | Appelt | H01L 25/0652 |
| 2019/0096854 A1* | 3/2019 | Koyanagi | G06F 3/0688 |
| 2019/0122928 A1 | 4/2019 | Norimoto | |
| 2019/0206797 A1* | 7/2019 | Lee | H01L 25/0655 |
| 2019/0206841 A1* | 7/2019 | Kim | H01L 25/0657 |
| 2019/0267287 A1 | 8/2019 | Hariharan et al. | |
| 2019/0371766 A1* | 12/2019 | Liu | H01L 24/92 |
| 2020/0051861 A1 | 2/2020 | Piao et al. | |
| 2021/0210467 A1* | 7/2021 | Koyanagi | H01L 25/0657 |
| 2021/0240615 A1* | 8/2021 | Sohn | H01L 24/17 |
| 2022/0115292 A1* | 4/2022 | Choi | H01L 23/5385 |
| 2022/0293565 A1* | 9/2022 | Shin | H01L 25/0657 |
| 2023/0011160 A1* | 1/2023 | Kim | H01L 25/0652 |
| 2023/0076511 A1* | 3/2023 | Suh | H01L 24/27 |

\* cited by examiner

SEMICONDUCTOR PACKAGE AND METHOD OF MANUFACTURING THE SEMICONDUCTOR PACKAGE

CROSS-REFERENCE TO RELATED APPLICATION

This U.S. nonprovisional patent application claims priority under 35 U.S.C. § 119 to Korean Patent Application No. 10-2020-0170458, filed on Dec. 8, 2020 in the Korean Intellectual Property Office (KIPO), the contents of which are herein incorporated by reference in their entirety.

BACKGROUND

1. Field

Example embodiments relate to a semiconductor package and a method of manufacturing the semiconductor package. More particularly, example embodiments relate to a semiconductor package including semiconductor chips stacked by a die-to-wafer bonding process and a method of manufacturing the same.

2. Description of the Related Art

In order to manufacture a multi-chip package in which at least two semiconductor chips are stacked, in a die-to-wafer bonding process, pad-to-pad direct bonding may be performed without using solder bumps.

However, in order to dice a wafer, a sawing process may be performed on a front surface of the wafer attached to a ring frame, so metal burrs formed in a scribe lane region of the sawed semiconductor chip may move and adhere to a bonding pad of the semiconductor chip. As a result, a bonding failure between the bonding pad of the semiconductor chip and a bonding pad of the wafer may occur in a subsequent die-to-wafer hybrid bonding process.

SUMMARY

Example embodiments provide a semiconductor package having a thin thickness and a stacked structure capable of improving the yield of a wafer bonding process.

Example embodiments provide a method of manufacturing the semiconductor package.

According to example embodiments, a semiconductor package includes a first semiconductor chip; a second semiconductor chip stacked on the first semiconductor chip, a third semiconductor chip stacked on the second semiconductor chip, and a fourth semiconductor chip stacked on third semiconductor chip. The second semiconductor chip includes: a second substrate, a second substrate front insulation layer on a front surface of the second substrate and having a first bonding pad in an outer surface thereof, a second substrate backside insulation layer on a backside surface of the second substrate and having a second bonding pad in an outer surface thereof, and a second substrate recess formed in an edge of the backside surface of the second substrate. The third semiconductor chip includes: a third substrate, a third substrate front insulation layer on a front surface of the third substrate and having a third bonding pad in an outer surface thereof, a third substrate backside insulation layer on a backside surface of the third substrate and having a fourth bonding pad in an outer surface thereof, and a first metal residual material provided in a peripheral region of the front surface of the third substrate. The fourth semiconductor chip includes: a fourth substrate and a fourth substrate front insulation layer on a front surface of the fourth substrate and having a fifth bonding pad in an outer surface thereof. When the second semiconductor chip and the third semiconductor chip are bonded to each other such that the front surface of the third substrate and the backside surface of the second substrate face each other, the first metal residual material is located in the second substrate recess.

According to example embodiments, a semiconductor package includes a first semiconductor chip, a second semiconductor chip, a third semiconductor chip and a fourth semiconductor chip sequentially stacked on one another. The second semiconductor chip includes a second substrate and a second substrate recess formed in an edge of a backside surface of the second substrate. The third semiconductor chip includes a third substrate and a first metal residual material provided in a peripheral region of a front surface of the third substrate. When the second semiconductor chip and the third semiconductor chip are bonded to each other such that the front surface of the third substrate and the backside surface of the second substrate face each other, the first metal residual material is located in the second substrate recess. A first bonding pad on the backside surface of the second substrate and a second bonding pad on the front surface of the third substrate are bonded to each other.

According to example embodiments, a semiconductor package includes a package substrate, a first semiconductor chip, a second semiconductor chip, a third semiconductor chip and a fourth semiconductor chip sequentially stacked on the package substrate, and a molding member on the package substrate to cover the first semiconductor chip, the second semiconductor chip, the third semiconductor chip and the fourth semiconductor chip. The second semiconductor chip includes a second substrate and a second substrate recess formed in an edge of a backside surface of the second substrate. The third semiconductor chip includes a third substrate and a first metal residual material provided in a peripheral region of a front surface of the third substrate. When the second semiconductor chip and the third semiconductor chip are bonded to each other such that the front surface of the third substrate and the backside surface of the second substrate face each other, the first metal residual material is located in the second substrate recess. A first bonding pad on the backside surface of the second substrate and a second bonding pad on the front surface of the third substrate are bonded to each other. A depth of the second substrate recess from the backside surface of the second substrate is within a range of 25 μm to 70 μm, and a width of the recess from an outer surface of the second substrate is within a range of 10 μm to 20 μm.

According to example embodiments, a semiconductor package may include a first semiconductor chip, a second semiconductor chip, a third semiconductor chip and a fourth semiconductor chip sequentially stacked on one another. When a backside surface of the second semiconductor chip and a front surface of the third semiconductor chip are bonded to face each other (face-to-face bonding), a metal residual material including a first metal residual structure remaining in a peripheral region of the front surface of the third semiconductor chip may be located in a second substrate recess formed in an edge of the backside surface of the second semiconductor chip. Additionally, when a backside surface of the third semiconductor chip and a front surface of the fourth semiconductor chip are bonded to each other (back-to-face bonding), a metal residual material including a second metal residual structure remaining in a peripheral region of the front surface of the fourth semiconductor chip may be located in a third substrate recess formed in an edge of the backside surface of the third semiconductor chip.

Accordingly, the second substrate recess and third substrate recess may prevent the metal residual materials from being formed between bonding surfaces of the second semiconductor chip and the third semiconductor chip and between the third semiconductor chip and the fourth semiconductor chip, to thereby prevent bonding failures due to the metal residual material. Thus, it may be possible to provide a stacked structure of a semiconductor package capable of improving a process yield of bonding a wafer and a die.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments.

FIG. 2 is an enlarged cross-sectional view illustrating portion 'A' in FIG. 1.

FIG. 3 is an enlarged cross-sectional view illustrating portion 'B' in FIG. 1.

FIG. 4, FIG. 5, FIG. 6, FIG. 7, FIG. 8, FIG. 9, FIG. 10, FIG. 11, FIG. 12, FIG. 13, FIG. 14, FIG. 15, and FIG. 16 are cross-sectional views illustrating a method of manufacturing a semiconductor package in accordance with example embodiments.

FIG. 17 is a cross-sectional view illustrating a semiconductor package in accordance with example embodiments.

FIG. 18 is a cross-sectional view illustrating a semiconductor package in accordance with example embodiments.

FIG. 19 and FIG. 20 are enlarged cross-sectional views illustrating recesses having various shapes.

DETAILED DESCRIPTION OF EXAMPLE EMBODIMENTS

Hereinafter, example embodiments will be explained in detail with reference to the accompanying drawings.

It will be understood that, although the terms first, second, third etc. may be used herein to describe various elements or components, these elements or components should not be limited by these terms. These terms are only used to distinguish one or more elements or components from another one or more elements or components. Thus, for example, a first bonding pad discussed below could be termed a third bonding pad or a fourth bonding pad, a second recess discussed below could be termed a first recess, and so on, without departing from the teachings of the inventive concept(s) described herein.

Figure 1:
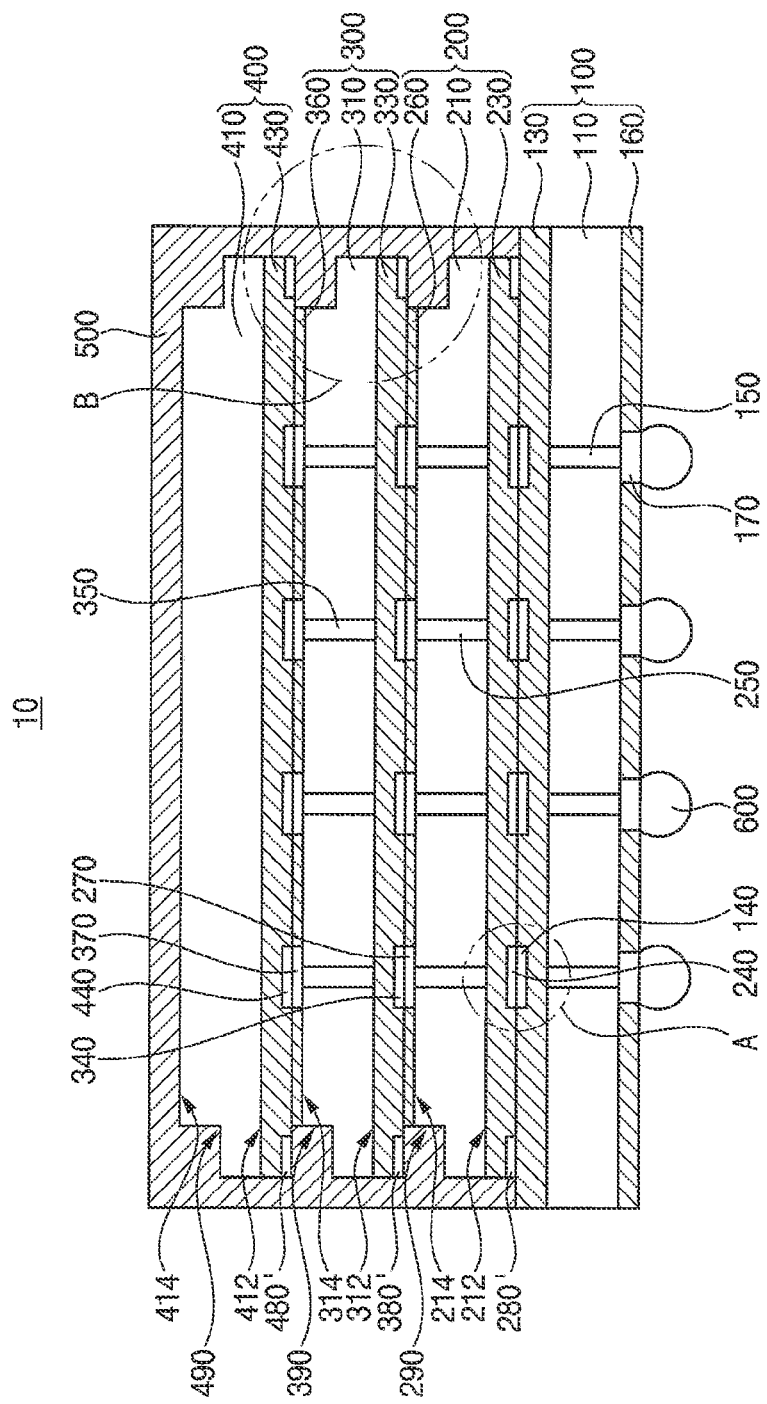
FIGS. 1 to 20 represent non-limiting, example embodiments as described herein.
Figure 2:
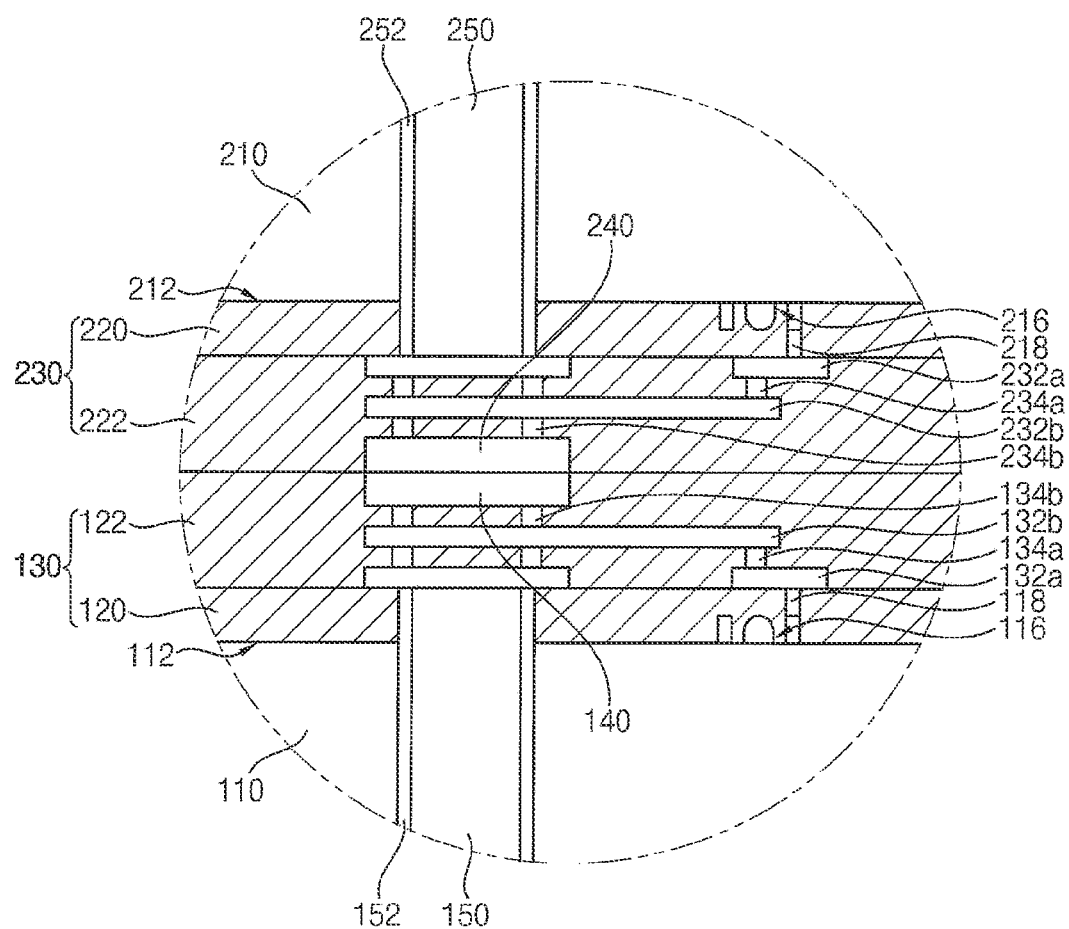
Figure 3:
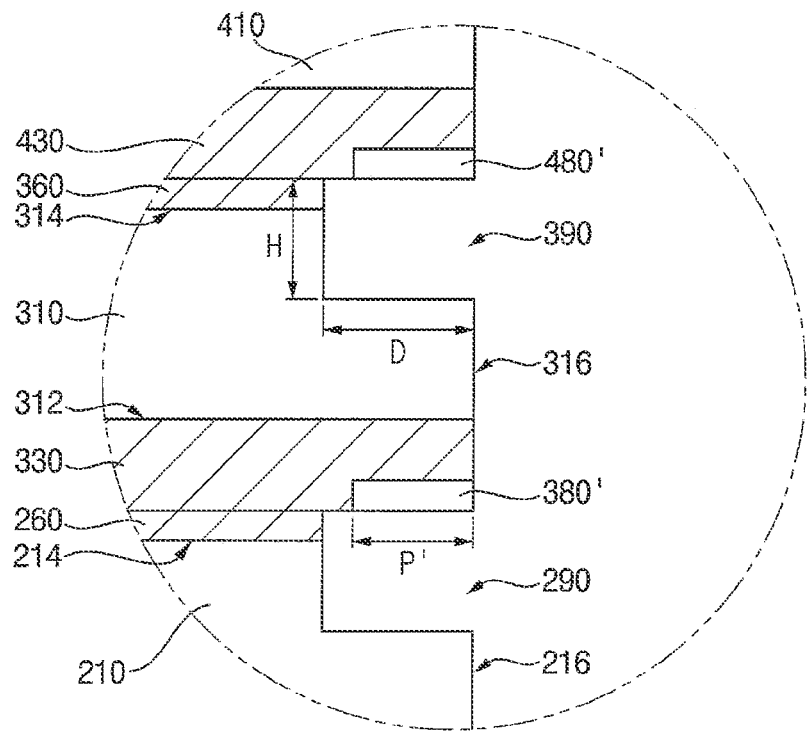

FIG. 1 is a cross-sectional view illustrating a semiconductor package in accordance with example embodiments. FIG. 2 is an enlarged cross-sectional view illustrating portion 'A' in FIG. 1. FIG. 3 is an enlarged cross-sectional view illustrating portion 'B' in FIG. 1.

Referring to FIG. 1, FIG. 2 and FIG. 3, a semiconductor package 10 may include semiconductor chips stacked therein. The semiconductor package 10 may include a first semiconductor chip 100, a second semiconductor chip 200, a third semiconductor chip 300, and a fourth semiconductor chip 400 stacked on one another.

A plurality of the first semiconductor chip 100, the second semiconductor chip 200, the third semiconductor chip 300 and the fourth semiconductor chip 400 may be stacked vertically. In this embodiment, the first semiconductor chip 100, the second semiconductor chip 200, the third semiconductor chip 300 and the fourth semiconductor chip 400 may be substantially the same or similar to each other. Thus, same or like reference numerals will be used to refer to the same or like elements and repeated descriptions of the same elements may be omitted.

Although the semiconductor package as a multi-chip package is illustrated as including four stacked semiconductor chips including the first semiconductor chip 100, the second semiconductor chip 200, the third semiconductor chip 300 and the fourth semiconductor chip 400, the semiconductor package is not limited thereto. For example, the semiconductor package may include 8, 12, or 16 stacked semiconductor chips.

Each of the first semiconductor chip 100, the second semiconductor chip 200, the third semiconductor chip 300 and the fourth semiconductor chip 400 may include an integrated circuit chip completed by performing semiconductor manufacturing processes. Each of the semiconductor chips may include, for example, a memory chip or a logic chip. The semiconductor package 10 may include a memory device. The memory device may include a high bandwidth memory (HBM) device.

Hereinafter, firstly, the first semiconductor chip 100 will be explained in detail.

The first semiconductor chip 100 may include a first substrate 110, a first substrate front insulation layer 130 having a first bonding pad 140 in an outer surface thereof, and a first substrate backside insulation layer 160 having a second bonding pad 170 in an outer surface thereof. Additionally, the first semiconductor chip 100 may include a first through electrode 150 penetrating through the first substrate 110.

The first substrate 110 may have a first surface 112 and a second surface 114 (e.g., see FIG. 12) opposite to each other. The first surface 112 may be an active surface, and the second surface 114 may be a non-active surface. Circuit patterns 116 may be provided on the first surface 112 of the first substrate 110. The first surface 112 may be referred to as a front surface on which the circuit patterns 116 are formed, and the second surface 114 may be referred to as a backside surface.

For example, the first substrate 110 may include silicon, germanium, silicon-germanium, or III-V compounds, e.g., GaP, GaAs, GaSb, etc. In some embodiments, the first substrate 110 may be a silicon-on-insulator (SOI) substrate, or a germanium-on-insulator (GOI) substrate.

The circuit patterns 116 may include a transistor, a diode, etc. The circuit patterns 116 may constitute circuit elements. Accordingly, the first semiconductor chip 100 may be a semiconductor device including a plurality of the circuit elements formed therein.

The first substrate front insulation layer 130 as an insulation interlayer may be formed on the first surface 112, i.e., the front surface of the first substrate 110. The first substrate front insulation layer 130 may include a plurality of insulation layers and wirings formed in the insulation layers. Additionally, the first bonding pad 140 may be provided in the outermost insulation layer of the first substrate front insulation layer 130.

For example, the first substrate front insulation layer 130 may include a first insulation interlayer 120 and a second insulation interlayer 122.

The first insulation interlayer 120 may be provided on the first surface 112 of the first substrate 110 to cover the circuit patterns 116. The first insulation interlayer 120 may be formed to include, for example, silicon oxide or a low dielectric material. The first insulation interlayer 120 may include lower wirings 118 therein.

The second insulation interlayer 122 may include buffer layers and insulation layers stacked alternately on one another. For example, the buffer layers may include silicon nitride, silicon carbon nitride (SiCN), silicon carbon oxynitride (SiCON), etc. The insulation layers may include silicon oxide, carbon doped silicon oxide, silicon oxynitride (SiCN), etc.

The second insulation interlayer 122 may include a plurality of wirings therein. For example, the second insulation interlayer 122 may include a first metal line 132a, a first contact 134a, a second metal line 132b and a second contact 134b. The first bonding pad 140 may be provided in the outermost insulation layer of the first substrate front insulation layer 130. The first bonding pad 140 may be exposed through the outer surface of the first substrate front insulation layer 130.

Accordingly, the circuit pattern 116 may be electrically connected to the first bonding pad 140 by the lower wirings 118 of the first insulation interlayer 120 and the wirings of the first substrate front insulation layer 130 (e.g., of the second insulation interlayer 122).

The first through electrode 150 may penetrate through the first substrate 110 and the first insulation interlayer 120 to make contact with the first metal line 132a. Accordingly, the first through electrode 150 may be electrically connected to the first bonding pad 140 by the wirings of the first substrate front insulation layer 130 (e.g., of the second insulation interlayer 122).

A liner layer 152 may be provided on an outer surface of the first through electrode 150. The liner layer may include silicon oxide or carbon doped silicon oxide. The liner layer 152 may insulate electrically the first substrate 110 and the first substrate front insulation layer 130 from the first through electrode 150.

The first substrate backside insulation layer 160 may be provided on the second surface 114, i.e., the backside surface of the first substrate 110. The second bonding pad 170 may be provided in the first substrate backside insulation layer 160. The first substrate backside insulation layer 160 may include silicon oxide, carbon doped silicon oxide, silicon carbon nitride (SiCN), etc. Accordingly, the first bonding pad 140 and the second bonding pad 170 may be electrically connected to each other by the first through electrode 150.

The first bonding pad 140 and the second bonding pad 170 and the first through electrode 150 may include the same metal. For example, the metal may include copper (Cu). However, the metal(s) of the first bonding pad 140 and the second bonding pad 170 are not limited thereto, and the metal(s) may include a material (e.g., gold (Au)) that can be bonded by inter-diffusion of metal by a high-temperature annealing process.

In example embodiments, the second semiconductor chip 200 may include a second substrate 210, a second substrate front insulation layer 230 provided on a front surface 212 of the second substrate 210, and a second substrate backside insulation layer 260 provided on a backside surface 214 of the second substrate 210. The second semiconductor chip 200 may further include a second through electrode 250 penetrating through the second substrate 210. A third bonding pad 240 may be provided in the outermost insulation layer of the second substrate front insulation layer 230. A fourth bonding pad 270 may be provided in the second substrate backside insulation layer 260. Additionally, the third bonding pad 240 may be referred to as a first bonding pad when considered in a context that does not include the first bonding pad 140 or the second bonding pad 170. The fourth bonding pad 270 may also be referred to as a first bonding pad when considered in a context that does not include the first bonding pad 140, the second bonding pad 170 or the third bonding pad 240. The fourth bonding pad 270 may also be referred to as a second bonding pad when considered in a context that include the third bonding pad 240 as a first bonding pad, but which otherwise does not include the first bonding pad 140 or the second bonding pad 170.

As illustrated in FIG. 2, the second semiconductor chip may be arranged on the first semiconductor chip such that the front surface 212 of the second substrate 210 faces the first surface 112 of the first substrate 110. The second substrate front insulation layer 230 and the first substrate front insulation layer 130 may be bonded directly to each other. Accordingly, the first bonding pad 140 and the third bonding pad 240 may be bonded to each other between the first semiconductor chip 100 and the second semiconductor chip 200 by Cu—Cu Hybrid Bonding (pad to pad direct bonding).

The outermost insulation layers of the first substrate front insulation layer 130 and the second substrate front insulation layer 230 may include the same insulating material to provide a bonding structure. The first substrate front insulation layer 130 and the second substrate front insulation layer 230 may be bonded to each other by a high-temperature annealing process while in contact with each other. In this case, the bonding structure may have a stronger bonding strength by covalent bonding.

In example embodiments, the third semiconductor chip 300 may include a third substrate 310, a third substrate front insulation layer 330 provided on a front surface 312 of the third substrate 310, and a third through electrode 350 penetrating through the third substrate 310. A fifth bonding pad 340 may be provided in the outermost insulation layer of the third substrate front insulation layer 330. A sixth bonding pad 370 may be provided in the third substrate backside insulation layer 360. The fifth bonding pad 340 may be referred to as a third bonding pad in a context that does not include the first bonding pad 140 or the second bonding pad 170, but which otherwise includes the third bonding pad 240 as a first bonding pad and the fourth bonding pad 270 as a second bonding pad. The fifth bonding pad 340 may also be referred to as a second bonding pad in a context that does not include the first bonding pad 140, the second bonding pad 170 or the third bonding pad 240, but which otherwise includes the fourth bonding pad 270 as a first bonding pad. The sixth bonding pad 370 may be referred to as a fourth bonding pad in a context that does not include the first bonding pad 140 or the second bonding pad 170, but which otherwise includes the third bonding pad 240 as a first bonding pad, the fourth bonding pad 270 as a second bonding pad and the fifth bonding pad 340 as a third bonding pad. The sixth bonding pad 370 may also be referred to as a third bonding pad in a context that does not include the first bonding pad 140, the second bonding pad 170, or the third bonding pad 240, but which otherwise includes the fourth bonding pad 270 as a first bonding pad and the fifth bonding pad 340 as a second bonding pad.

The fourth semiconductor chip 400 may include a fourth substrate 410 and a fourth substrate front insulation layer 430 provided on a front surface 412 of the fourth substrate 410. A seventh bonding pad 440 may be provided in the outermost insulation layer of the fourth substrate front insulation layer 430. The seventh bonding pad 440 may be referred to as a fifth bonding pad in a context that does not include the first bonding pad 140 or the second bonding pad 170, but which otherwise includes the third bonding pad 240 as a first bonding pad, the fourth bonding pad 270 as a second bonding pad, the fifth bonding pad 340 as a third bonding pad and the sixth bonding pad 370 as a fourth bonding pad. The seventh bonding pad 440 may be referred to as a fourth bonding pad in a context that does not include the first bonding pad 140, the second bonding pad 170 or the third bonding pad 240, but which otherwise includes the fourth bonding pad 270 as a first bonding pad, the fifth bonding pad 340 as a second bonding pad and the sixth bonding pad 370 as a third bonding pad.

In example embodiments, the second semiconductor chip 200 may be bonded to the first semiconductor chip 100 such that a front surface of the second semiconductor chip 200, i.e., the front surface 212 of the second substrate 210, faces a front surface of the first semiconductor chip 100, i.e., the first surface 112 of the first substrate 110. The first substrate front insulation layer 130 of the first semiconductor chip 100 and the second substrate front insulation layer 230 of the second semiconductor chip 200 may be bonded directly to each other. The first bonding pad 140 of the first semiconductor chip 100 may be bonded directly to the third bonding pad 240 of the second semiconductor chip 200. Accordingly, the first bonding pad 140 and the third bonding pad 240 may be bonded to each other between the first semiconductor chip 100 and the second semiconductor chip 200 by Cu—Cu Hybrid Bonding.

The third semiconductor chip 300 may be bonded to the second semiconductor chip 200 such that a front surface of the third semiconductor chip 300, i.e., the front surface 312 of the third substrate 310, faces a backside surface of the second semiconductor chip 200, i.e., the backside surface 214 of the second substrate 210. The second substrate backside insulation layer 260 of the second semiconductor chip 200 and the third substrate front insulation layer 330 of the third semiconductor chip 300 may be bonded directly to each other. The fourth bonding pad 270 of the second semiconductor chip 200 may be bonded directly to the fifth bonding pad 340 of the third semiconductor chip 300. Accordingly, the fourth bonding pad 270 and the fifth bonding pad 340 may be bonded to each other between the second semiconductor chip 200 and the third semiconductor chip 300 by Cu—Cu Hybrid Bonding.

The fourth semiconductor chip 400 may be bonded to the third semiconductor chip 300 such that a front surface of the fourth semiconductor chip 400, i.e., the front surface 412 of the fourth substrate 410, faces a backside surface of the third semiconductor chip 300, i.e., the backside surface 314 of the third substrate 310. The third substrate backside insulation layer 360 of the third semiconductor chip 300 and the fourth substrate front insulation layer 430 of the fourth semiconductor chip 400 may be bonded directly to each other. The sixth bonding pad 370 of the third semiconductor chip 300 may be bonded directly to the seventh bonding pad 440 of the fourth semiconductor chip 400. Accordingly, the sixth bonding pad 370 and the seventh bonding pad 440 may be bonded to each other between the third semiconductor chip 300 and the fourth semiconductor chip 400 by Cu—Cu Hybrid Bonding.

As illustrated in FIG. 1, in example embodiments, the second semiconductor chip 200 may include a second metal residual structure 280' in a peripheral region of the front surface 212 of the second substrate 210. The second metal residual structure 280' may be a metal residual material that remains after a portion of a metal pattern, which is formed in a scribe lane region area, is removed when a dicing process for the second semiconductor chip 200 is performed. The metal pattern may serve as a test pad in a design process or as an inspection key in a wiring process such as a plating process.

The second metal residual structure 280' may be provided in at least one of four peripheral regions of the front surface 212 of the second substrate 210. A plurality of the second metal residual structures may be spaced apart from each other along the peripheral region of the front surface 212 of the second substrate 210. A length of the second metal residual structure 280' extending along the peripheral region may be within a range of 20 μm to 100 μm, and a width P' of the second metal residual structure 280' may be within a range of 3 μm to 15 μm.

Similarly, the third semiconductor chip 300 and the fourth semiconductor chip 400 may also include a third metal residual structure 380' and a fourth metal residual structure 480' in peripheral regions of the front surfaces, respectively. The third metal residual structure 380' may be referred to as a first metal residual structure and the fourth metal residual structure 480' may be referred to as a second metal residual structure in a context that does not specify a second metal residual structure 280' for a second semiconductor chip 200 or a first metal residual structure 180' for a first semiconductor chip 100.

In example embodiments, the second semiconductor chip 200 may include a second substrate recess 290 formed in an edge of the backside surface 214 of the second substrate 210. The second substrate recess 290 may be positioned between the backside surface 214 and an outer surface 216 of the second substrate 210. The second substrate recess 290 may have a stepped shape formed in each of four edges of the backside surface 214 of the second substrate 210.

A depth H of the second substrate recess 290 from the backside surface 214 of the second substrate 210 may be within a range of 25 μm to 70 μm, and a width D of the second substrate recess 290 from the outer surface 216 of the second substrate 210 may be within a range of 10 μm to 20 μm.

Similarly, the third semiconductor chip 300 and the fourth semiconductor chip 400 may also include third substrate recess 390 and fourth substrate recess 490 in edges of the backside surfaces, respectively.

When the second semiconductor chip 200 and the third semiconductor chip 300 are bonded to each other by pad-to-pad direct bonding, the third metal residual structure 380' remaining in the peripheral region of the front surface of the third semiconductor chip 300 may be located in the second substrate recess 290 formed in the edge of the backside surface of the second semiconductor chip 200. Accordingly, the second substrate recess 290 may prevent the third metal residual material from being interposed between the bonded surfaces of the second semiconductor chip 200 and the third semiconductor chip 300, to thereby prevent a bonding failure due to the metal residual material.

Additionally, when the third semiconductor chip 300 and the fourth semiconductor chip 400 are bonded to each other by pad-to-pad direct bonding, the fourth metal residual structure 480' remaining in the peripheral region of the front surface of the fourth semiconductor chip 400 may be located in the third substrate recess 390 formed in the edge of the backside surface of the third semiconductor chip 300.

Accordingly, the third substrate recess 390 may prevent the fourth metal residual material from being interposed between the bonded surfaces of the third semiconductor chip 300 and the fourth semiconductor chip 400, to thereby prevent a bonding failure due to the metal residual material.

In example embodiments, the semiconductor package 10 may further include a sealing member 500 covering the second semiconductor chip 200, the third semiconductor chip 300 and the fourth semiconductor chip 400 on the first semiconductor chip 100. The sealing member 500 may cover side surfaces of the second semiconductor chip 200, the third semiconductor chip 300 and the fourth semiconductor chip 400. The sealing member 500 may cover an upper surface of the fourth semiconductor chip 400. For example, the sealing member 500 may include a thermosetting resin or the like.

Additionally, the semiconductor package 10 may include one or more solder bumps 600 as conductive connection members respectively disposed on the second bonding pads 170 of the first semiconductor chip 100.

As described above, each of the second semiconductor chip 200, the third semiconductor chip 300 and the fourth semiconductor chip 400 may include the recess formed in the edge of the backside surface of each of the second substrate 210, the third substrate 310 and the fourth substrate 410.

When the backside surface of the second semiconductor chip 200 and the front surface of the third semiconductor chip 300 are bonded to each other (back-to-face bonding), a metal residual material including the third metal residual structure 380' remaining in the peripheral region of the front surface of the third semiconductor chip 300 may be located in the second substrate recess 290 formed in the edge of the backside surface of the second semiconductor chip 200.

When the backside surface of the third semiconductor chip 300 and the front surface of the fourth semiconductor chip 400 are bonded to each other (back-to-face bonding), a metal residual material including the fourth metal residual structure 480' remaining in the peripheral region of the front surface of the fourth semiconductor chip 400 may be located in the third substrate recess 390 formed in the edge of the backside surface of the third semiconductor chip 300.

Accordingly, the second substrate recess 290 and the third substrate recess 390 may prevent the metal residual materials from being formed between the bonding surfaces of the second semiconductor chip 200 and the third semiconductor chip 300 and between the third semiconductor chip 300 and the fourth semiconductor chip 400, to thereby prevent bonding failures due to the metal residual material. Thus, it may be possible to provide a stacked structure of a semiconductor package capable of improving a process yield of bonding a wafer and a die.

Hereinafter, a method of manufacturing the semiconductor package in FIG. 1 will be explained.

FIG. 4, FIG. 5, FIG. 6, FIG. 7, FIG. 8, FIG. 9, FIG. 10, FIG. 11, FIG. 12, FIG. 13, FIG. 14, FIG. 15, and FIG. 16 are cross-sectional views illustrating a method of manufacturing a semiconductor package in accordance with example embodiments. FIG. 5 and FIG. 7 to FIG. 16 are cross-sectional view taken along the line C-C' in FIG. 4. FIG. 6 is an enlarged cross-sectional view illustrating portion 'D' in FIG. 5.

Figure 4:
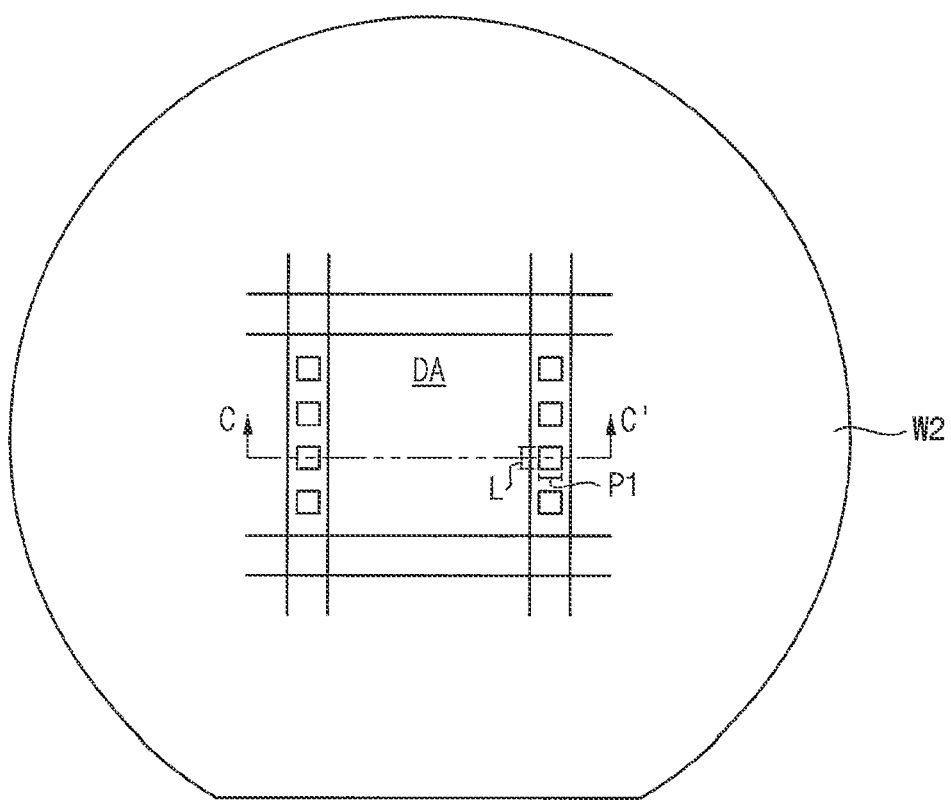
Figure 5:
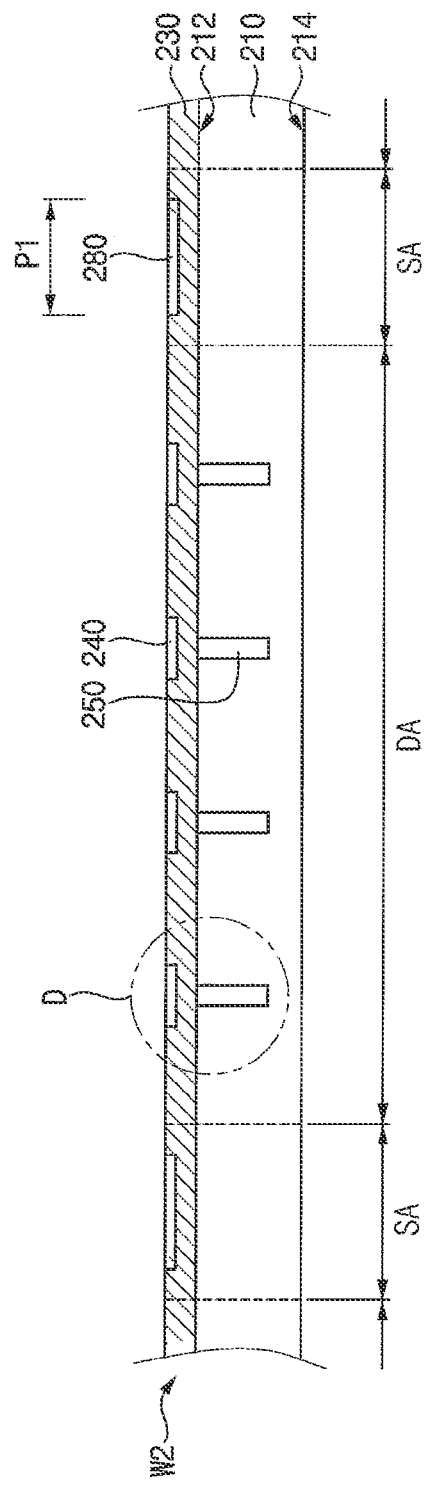
Figure 6:
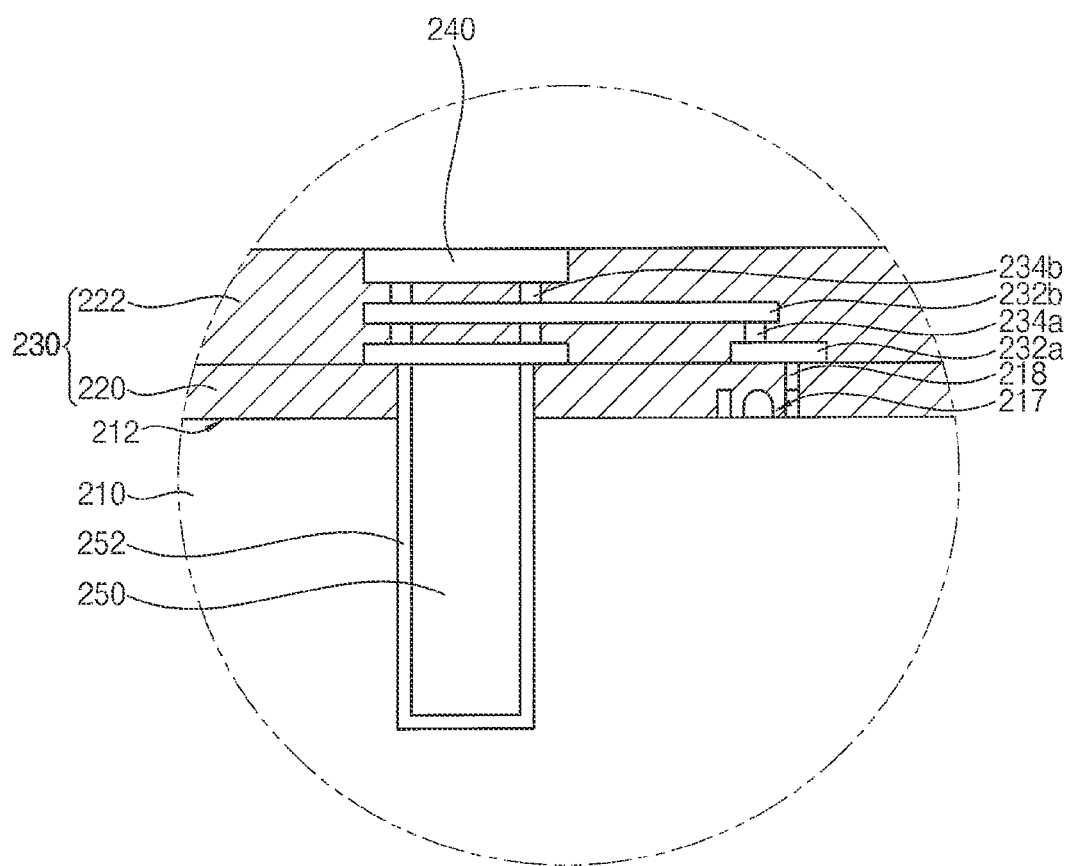

Referring to FIG. 4, FIG. 5 and FIG. 6, first, a second wafer W2 including a plurality of second semiconductor chips (dies) formed therein may be prepared.

In example embodiments, the second wafer W2 may include a second substrate 210 and a second substrate front insulation layer 230 having a third bonding pad 240 provided in an outer surface thereof. Additionally, the second wafer W2 may include a second through electrode 250 that is provided in the second substrate 210 and is electrically connected to the third bonding pad 240.

The second substrate 210 may have a front surface 212 as a first surface and a backside surface 214 as a second surface, opposite to each other. The second substrate 210 may include a die region DA where circuit patterns and cells are formed and a scribe lane region SA surrounding the die region DA. The second substrate 210 may be sawed along the scribe lane region SA dividing the die regions DA by a following singulation process to form an individual semiconductor chip.

For example, the second substrate 210 may include silicon, germanium, silicon-germanium, or III-V compounds, e.g., GaP, GaAs, GaSb, etc. In some embodiments, the second substrate 210 may be a silicon-on-insulator (SOI) substrate, or a germanium-on-insulator (GOI) substrate.

The circuit pattern(s) 217 of the die region DA may include a transistor, a capacitor, a diode, etc. The circuit pattern(s) 217 may constitute circuit elements. Accordingly, the second semiconductor chip may be a semiconductor device including a plurality of the circuit elements formed therein. The circuit pattern(s) 217 may be formed by performing a front end of line (FEOL) process for manufacturing a semiconductor device on the front surface 212 of the second substrate. The surface of the second substrate on which the FEOL process is performed may be referred to as a front surface of the second substrate, and a surface opposite to the front surface may be referred to as a backside surface.

The second substrate front insulation layer 230 may be formed as an insulation interlayer on the front surface 212, i.e., the front surface of the second substrate 210. The second substrate front insulation layer 230 may include a plurality of insulation layers and wirings in the insulation layers. A third bonding pad 240 may be provided in the outermost insulation layer of the second substrate front insulation layer 230.

As illustrated in FIG. 6, for example, the second substrate front insulation layer 230 may include a first insulation interlayer 220 and a second insulation interlayer 222.

The first insulation interlayer 220 may be provided on the front surface 212 of the second substrate 210 and may cover the circuit patterns(s) 217 on the front surface 212 of the second substrate 210. The first insulation interlayer 220 may include, for example, silicon oxide or a low dielectric material. The first insulation interlayer 220 may include the lower wirings 218.

The second insulation interlayer 222 may include buffer layers and insulation layers stacked alternately on one another. For example, the buffer layers include silicon nitride, silicon carbon nitride (SiCN), silicon carbon oxynitride (SiCON), etc. The insulation layer may include silicon oxide, carbon doped silicon oxide, silicon carbon nitride (SiCN), etc.

The second insulation interlayer 222 may include a plurality of metal wirings. For example, the second insulation interlayer 222 may include a first metal line 232a, a first contact 234a, a second metal line 232b, and a second contact 234b. The third bonding pad 240 may be provided in the outermost insulation layer of the second substrate front insulation layer 230. The third bonding pad 240 may be exposed through an outer surface of the second substrate front insulation layer 230.

Accordingly, the circuit pattern(s) 217 may be electrically connected to the third bonding pad 240 by the lower wirings 218 of the first insulation interlayer 220 and the wirings of the second substrate front insulation layer 230 (e.g., of the second insulation interlayer 222).

The second through electrode 250 may penetrate through the first insulation interlayer 220 and extend to a predetermined depth from the front surface 212 of the second substrate 210. The second through electrode 250 may make contact with the first metal line 232a. Accordingly, the second through electrode 250 may be electrically connected to the third bonding pad 240 by the wirings of the second substrate front insulation layer 230 (e.g., of the second insulation interlayer 222).

A liner layer 252 may be provided on an outer surface of the second through electrode 250. The liner layer may include silicon oxide or carbon doped silicon oxide. The liner layer 252 may insulate electrically the second substrate 210 and the second substrate front insulation layer 230 from the second through electrode 250.

As illustrated in FIG. 4 and FIG. 5, a plurality of metal patterns 280 may be formed on the front surface 212 of the second substrate 210 in the scribe lane region SA. The metal patterns 280 may be provided in the scribe lane region SA extending in a first direction (horizontal direction) and/or in the scribe lane region SA extending in a second direction (vertical direction) perpendicular to the first direction.

The metal pattern 280 may serve as a test pad in a design process or as an inspection key in a wiring process such as a plating process. A width of the scribe lane region SA may be within a range of 100 μm to 140 μm. A length L of the metal pattern 280 may be within a range of 20 μm to 100 μm, and a width P1 of the metal pattern 280 may be within a range of 40 μm to 60 μm.

As described later, a portion of the metal pattern may be removed in a following dicing process, and the remaining portion of the metal pattern may be used as a second metal residual structure 280' (see FIG. 10) on the front surface 212 of the second substrate 210.

Figure 7:
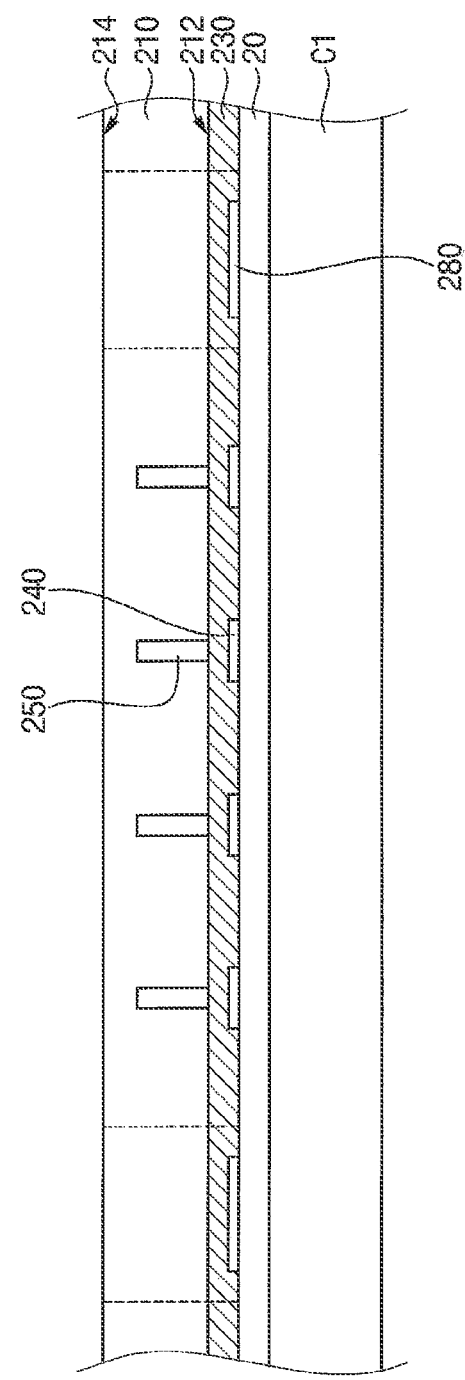
Figure 8:
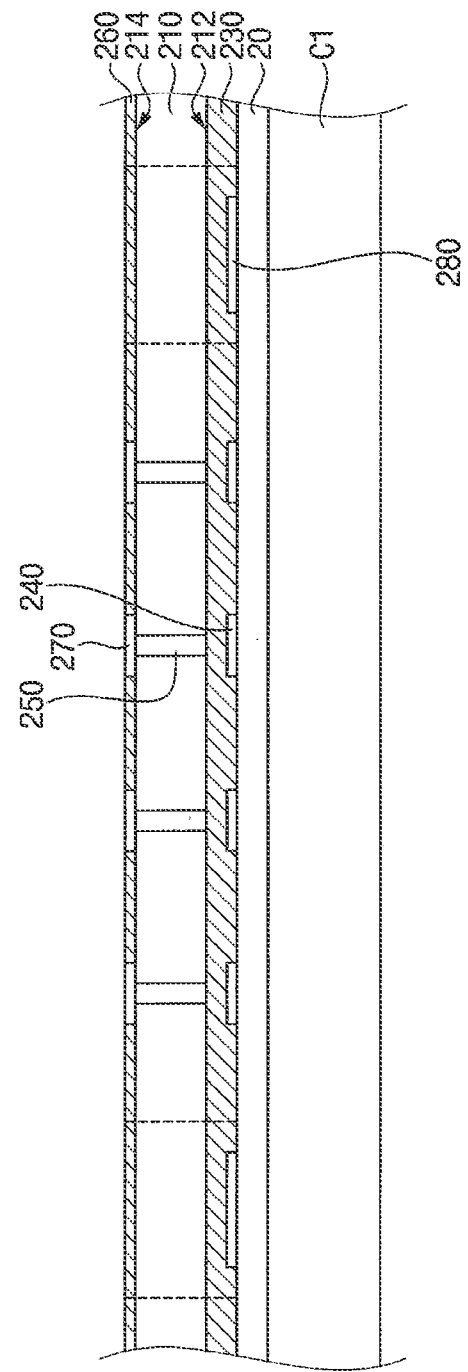

Referring to FIG. 7 and FIG. 8, a backside surface 214, i.e., the second surface of the second substrate 210 may be grinded using a substrate support system (WSS). After attaching the second wafer W2 on a carrier substrate C1 using a first adhesive film 20, the backside surface 214 of the second substrate 210 may be partially removed until a portion of the second through electrode 250 is exposed.

The backside surface 214 of the second substrate 210 may be partially removed by a grinding process such as a chemical mechanical polishing (CMP) process. Accordingly, a thickness of the second substrate 210 may be reduced to a desired thickness. For example, the second substrate 210 may have a thickness range of about 50 μm to 150 μm. In addition, an end portion of the second through electrode 250 may be exposed from the backside surface 214 of the second substrate 210.

As illustrated in FIG. 8, a second substrate backside insulation layer 260 having a fourth bonding pad 270 that is electrically connected to the second through electrode 250 may be formed on the backside surface 214 of the second substrate 210.

After forming the second substrate backside insulation layer 260 on the backside surface 214 of the second substrate 210, an opening may be formed in the second substrate backside insulation layer 260 to expose the second through electrode 250 and a plating process may be performed to forming the fourth bonding pad 270. The fourth bonding pad 270 may be disposed on the exposed surface of the second through electrode 250. The second substrate backside insulation layer 260 may include silicon oxide, carbon-doped silicon oxide, silicon carbonitride (SiCN), etc. Accordingly, the third bonding pad 240 and the fourth bonding pad 270 may be electrically connected to each other by the second through electrode 250.

Figure 9:
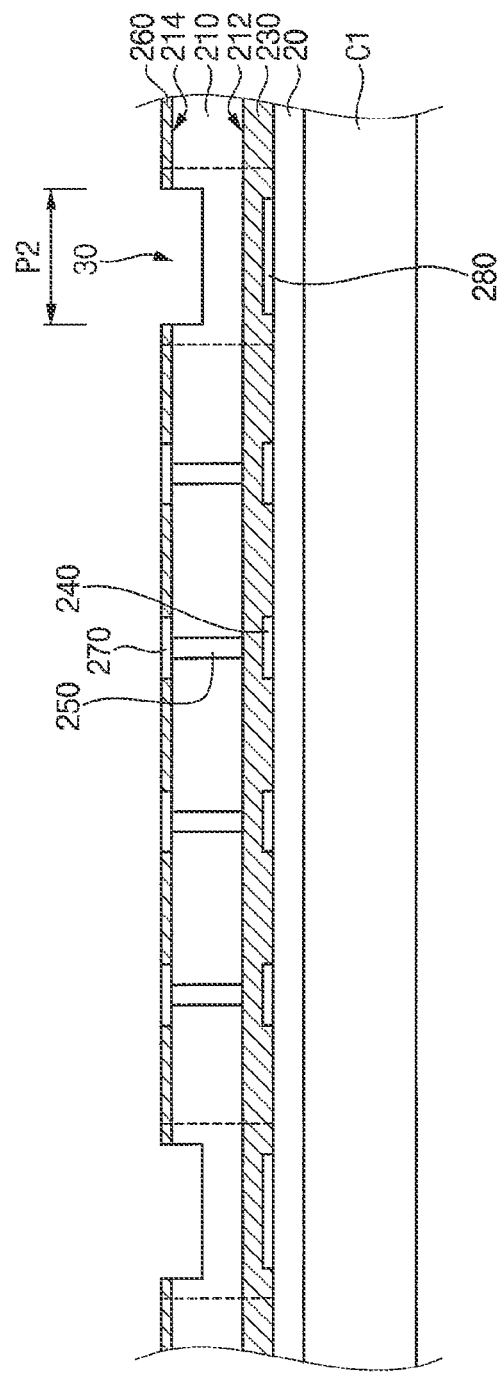
Figure 10:
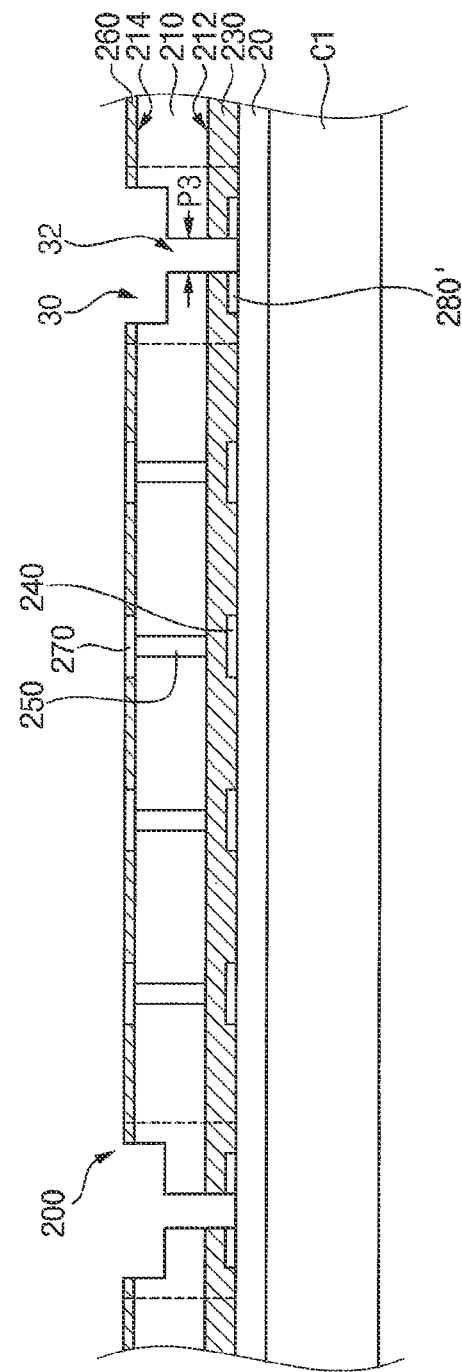
Figure 11:
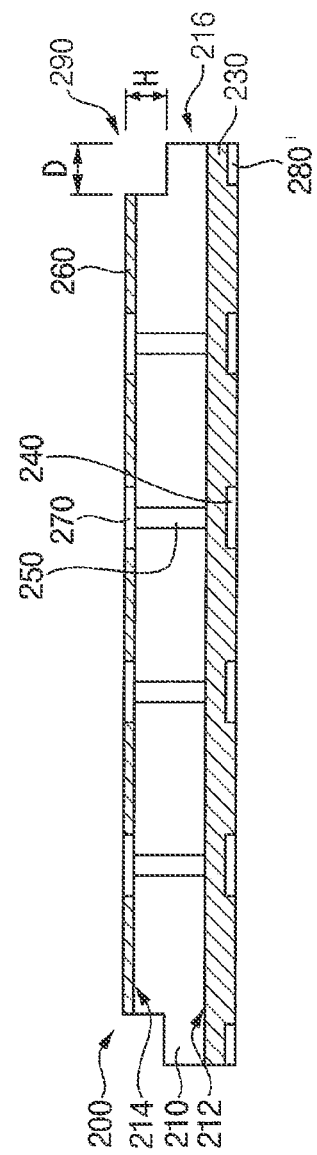

Referring to FIG. 9, FIG. 10 and FIG. 11, the second wafer W2 may be cut along the scribe lane region SA to form the second semiconductor chip 200 as an individual semiconductor chip.

Referring to FIG. 9 and FIG. 10, in example embodiments, the second wafer W2 may be divided into individual chips by a dual dicing process.

In particular, a first dicing process may be performed on the backside surface 214 of the second substrate 210 in the scribe lane region SA to form a first groove 30 with a first width P2 and a first depth D1.

Then, a second dicing process may be performed on the backside surface 214 of the second substrate 210 in the scribe lane region SA to form a second groove 32 that penetrates the second substrate 210. The second groove 32 may have a second width P3 smaller than the first width P2. A portion of the metal pattern 280 may be removed by the second dicing process to form a second metal residual structure 280' on the front surface 212 of the second substrate 210.

The first dicing process and the second dicing process may include sawing processes using blades having different widths. Alternatively, the first dicing process and the second dicing process may include etching processes or laser sawing processes.

For example, the first width P2 may be within a range of 35 μm to 80 μm, and the first depth D1 may be within a range of 25 μm to 70 μm. The second width P3 may be within a range of 15 μm to 40 μm. A width of the second metal residual structure 280' may be within a range of 3 μm to 15 μm.

As illustrated in FIG. 11, the second wafer W2 may be cut by the dual dicing process to form the second semiconductor chip 200 as an individual semiconductor chip. A second substrate recess 290 may be formed in an edge of the backside surface 214 of the second substrate 210 of the second semiconductor chip 200 by the dual dicing process. The second substrate recess 290 may have a stepped shape formed in each of four edges of the backside surface 214 of the second substrate 210.

A depth H of the second substrate recess 290 from the backside surface 214 of the second substrate 210 may be within a range of 25 μm to 70 μm, and a width D of the second substrate recess 290 from an outer surface 216 of the second substrate 210 may be within a range of 10 μm to 20 μm.

In addition, when the second wafer W2 is cut, a portion of the metal pattern 280 on the front surface 212 of the second substrate 210 in the scribe lane area SA may be also cut to form the second metal residual structure 280' on a peripheral region of the second substrate 210. A width of the second metal residual structure 280' may be within a range of 3 μm to 15 μm.

In a conventional dicing process, since a sawing process is performed on a front surface of a wafer that is attached to a ring frame, metal burrs formed in a scribe lane region of the sawed semiconductor chip may move to be adhered onto a bonding pad.

On the other hand, in example embodiments, since the dual dicing process is performed on the backside surface 214 of the second wafer W2 attached on the carrier substrate C1 to form multiple of the second semiconductor chip 200, metal foreign substances formed in the scribe lane region may be prevented from moving onto the bonding pad, to thereby prevent a bonding failure in a following die-to-wafer hybrid bonding process.

Figure 12:
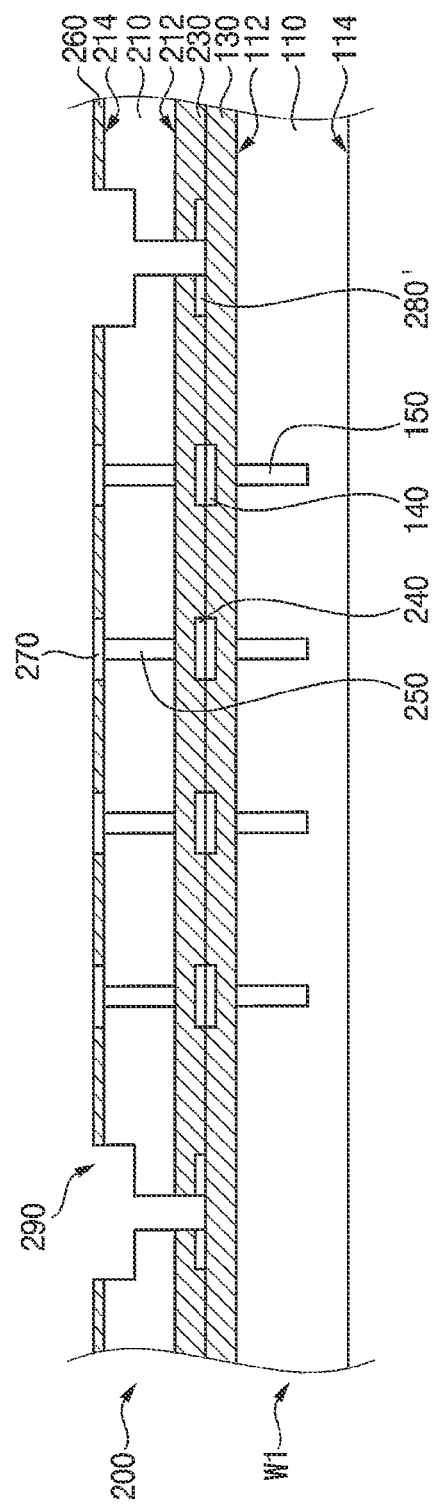

Referring to FIG. 12, a plurality of the second semiconductor chip 200 may be attached onto a first wafer W1 (die-to-wafer hybrid bonding process).

In example embodiments, each second semiconductor chip 200 may be disposed on the first wafer W1 corresponding to die regions DA of the first wafer W1. The second semiconductor chip 200 may be stacked on the first wafer W1 such that the front surface 212 of the second substrate 210 of the second semiconductor chip 200 faces toward the first wafer W1.

The second semiconductor chip 200 may be attached on a first surface 112 of the first wafer W1 by performing a thermal compression process at a predetermined temperature (e.g., about 400° C. or less). By the thermal compression process, the second semiconductor chip 200 and the first wafer W1 may be bonded to each other by hybrid bonding. That is, the second substrate front insulation layer 230 on a front surface of the second semiconductor chip 200, i.e., the front surface 212 of the second substrate 210, may be directly bonded to a first substrate front insulation layer 130 on a first substrate 110 of the first wafer W1.

A first bonding pad 140 of the first wafer W1 and the third bonding pad 240 of the second semiconductor chip 200 may contact each other. The second semiconductor chip 200 and the first wafer W1 may be bonded to each other such that the front surface of the second semiconductor chip 200 and a front surface of the first wafer W1 face each other. When the second semiconductor chip 200 and the first wafer W1 are bonded to each other, the first bonding pad 140 of the first wafer W1 and the third bonding pad 240 of the second semiconductor chip 200 may be bonded to each other by Cu—Cu Hybrid Bonding.

Figure 13:
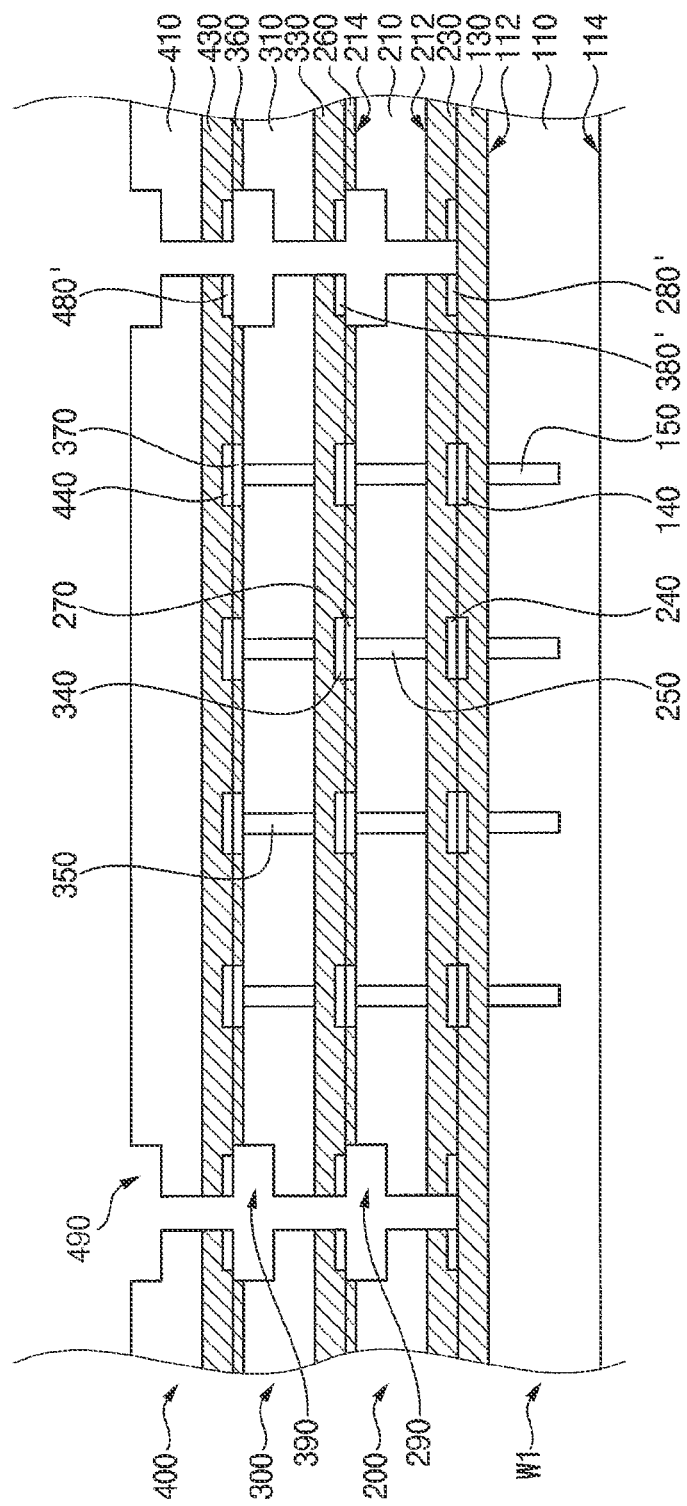

Referring to FIG. 13, processes the same as or similar to the processes described with reference to FIG. 4 to FIG. 12 may be performed to form third semiconductor chip 300 and fourth semiconductor chip 400. The third semiconductor chip 300 and the fourth semiconductor chip 400 may be arranged sequentially on the second semiconductor chip 200. The third semiconductor chip 300 may be stacked on the second semiconductor chip 200 such that a front surface of the third semiconductor chip 300 faces toward a backside surface of the second semiconductor chip 200. The fourth semiconductor chip 400 may be stacked on the third semiconductor chip 300 such that a front surface of the fourth semiconductor chip 400 faces toward a backside surface of the third semiconductor chip 300.

By a thermal compression process, the third semiconductor chip 300 and the second semiconductor chip 200 may be bonded to each other by hybrid bonding. That is, a third substrate front insulation layer 330 on the front surface of the third semiconductor chip 300 may be directly bonded to the second substrate backside insulation layer 260 on a backside surface of the second semiconductor chip 200.

When the second semiconductor chip 200 and the third semiconductor chip 300 are bonded to each other, the fourth bonding pad 270 of the second semiconductor chip 200 and a fifth bonding pad 340 of the third semiconductor chip 300 may be bonded to each other by Cu—Cu Hybrid Bonding.

Similarly, by a thermal compression process, the fourth semiconductor chip 400 and the third semiconductor chip 300 may be bonded to each other by hybrid bonding. That is, a fourth substrate front insulation layer 430 on a front surface of the fourth semiconductor chip 400 may be directly bonded to a third substrate backside insulation layer 360 on a backside surface of the third semiconductor chip 300.

When the third semiconductor chip 300 and the fourth semiconductor chip 400 are bonded to each other, a sixth bonding pad 370 of the third semiconductor chip 300 and a seventh bonding pad 440 of the fourth semiconductor chip 400 may be bonded to each other by Cu—Cu Hybrid Bonding.

It will be appreciated that the number of stacked semiconductor chips is not limited to the specific examples described for embodiments herein. For example, 4, 8 or 12 semiconductor chips may be sequentially stacked on the fourth semiconductor chip 400.

In example embodiments, when the second semiconductor chip 200 and the third semiconductor chip 300 are bonded to each other by pad-to-pad direct bonding, a metal residual material including a third metal residual structure 380' remaining in a peripheral region of the front surface of the third semiconductor chip 300 may be located in the second substrate recess 290 formed in the edge of the backside surface of the second semiconductor chip 200. Accordingly, the second substrate recess 290 may prevent the metal residual material from being formed between the bonded surfaces of the second semiconductor chip 200 and the third semiconductor chip 300, to thereby prevent a bonding failure due to the metal residual material.

Additionally, when the third semiconductor chip 300 and the fourth semiconductor chip 400 are bonded to each other by pad-to-pad direct bonding, a metal residual material including a fourth metal residual structure 480' remaining in a peripheral region of the front surface of the fourth semiconductor chip 400 may be located in a third substrate recess 390 formed in an edge of the backside surface of the third semiconductor chip 300. Accordingly, the third substrate recess 390 may prevent the metal residual material from being formed between the bonded surfaces of the third semiconductor chip 300 and the fourth semiconductor chip 400, to thereby prevent a bonding failure due to the metal residual material.

Figure 14:
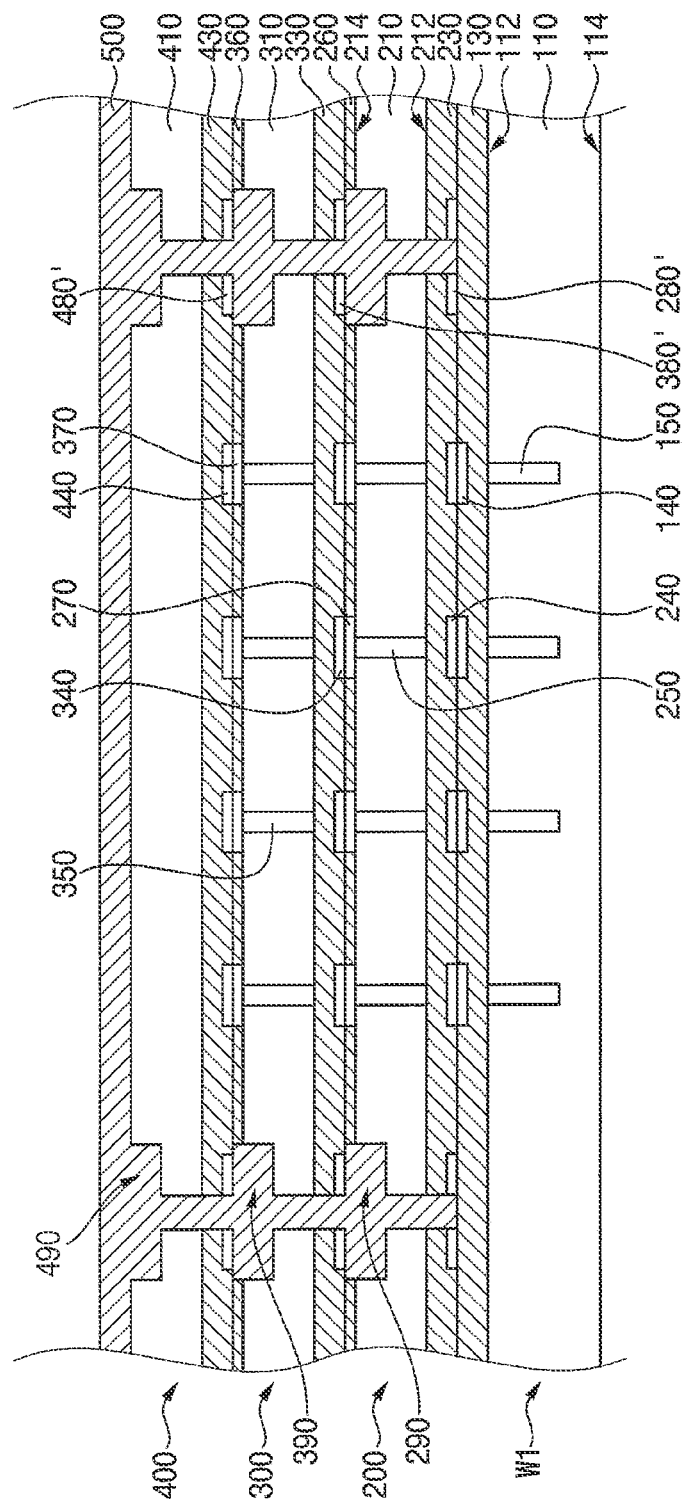

Referring to FIG. 14, a sealing member 500 filling between the stacked structures of the second semiconductor chip 200, the third semiconductor chip 300 and the fourth semiconductor chip 400 may be formed.

In example embodiments, the sealing member 500 may be formed to fill spaces between the second semiconductor chip 200, the third semiconductor chip 300 and the fourth semiconductor chip 400 on the first wafer W1. The sealing member 500 may be formed to surround the second semiconductor chip 200, the third semiconductor chip 300 and the fourth semiconductor chip 400. The sealing member 500 may be formed by a dispensing process or a spin coating process. For example, the sealing member 500 may include a thermosetting resin or the like.

Figure 15:
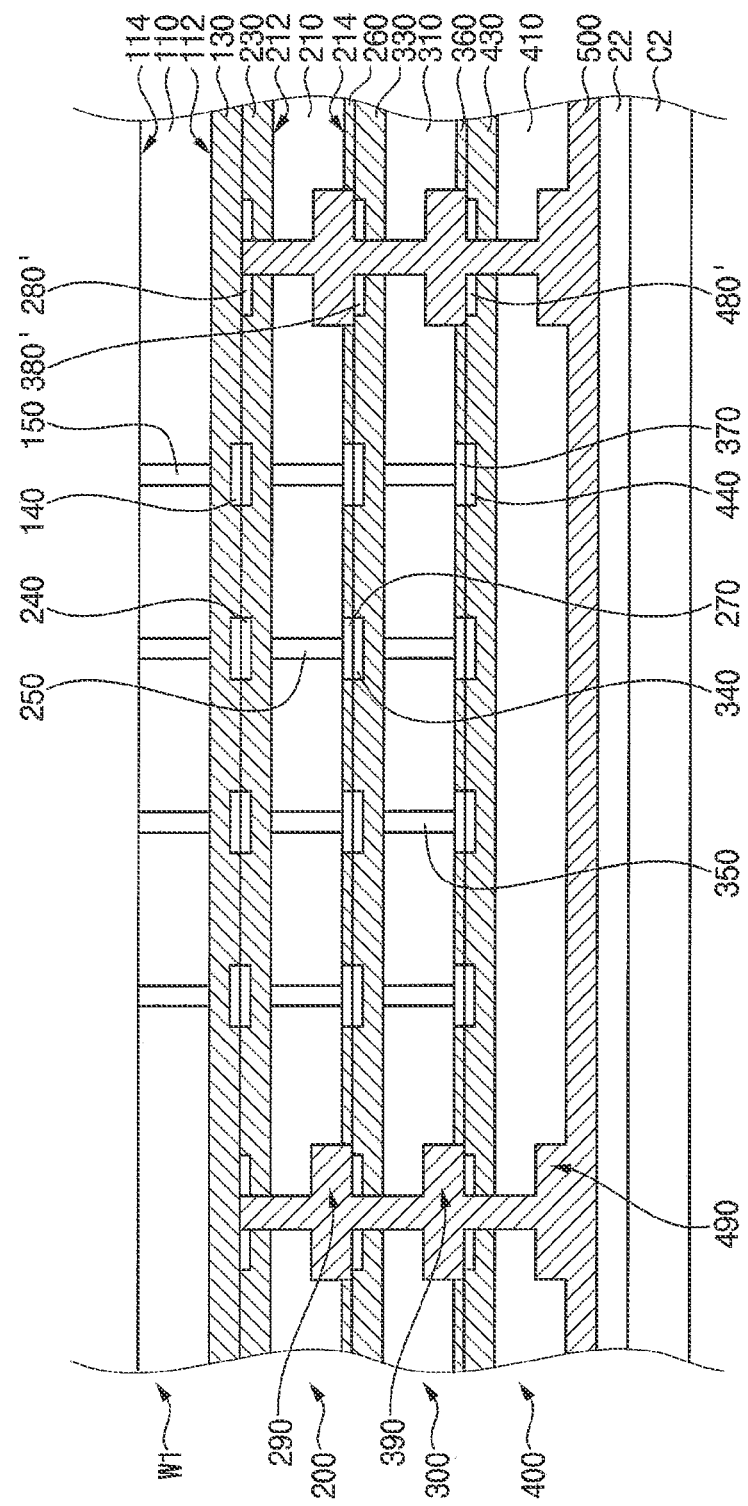
Figure 16:
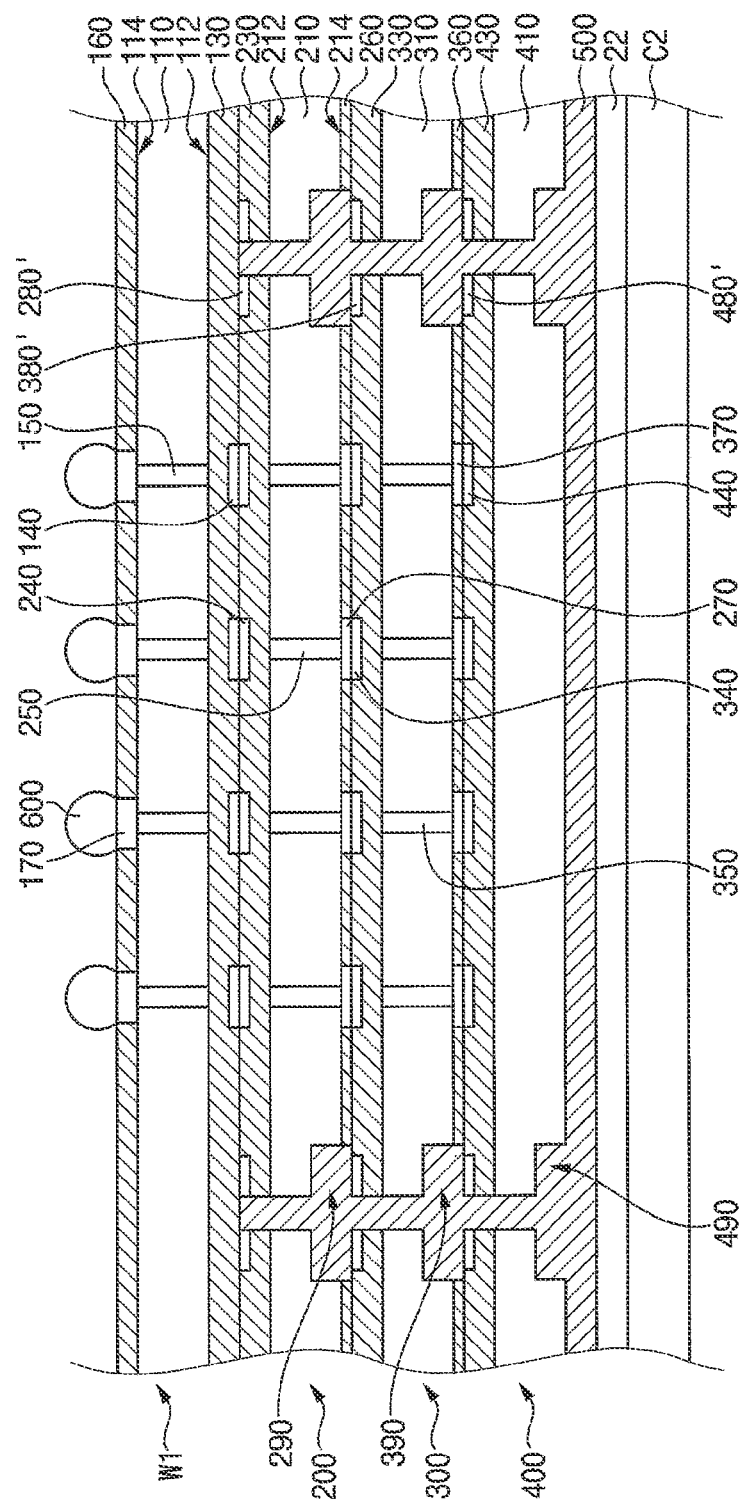

Referring to FIG. 15 and FIG. 16, a first substrate backside insulation layer 160 having a second bonding pad 170 that is electrically connected to the first through electrode 150 may be formed on a second surface 114 of the first substrate 110 of the first wafer W1. One or more solder bumps 600 as a conductive connection member may be formed on the second bonding pad 170.

As illustrated in FIG. 15, a backside surface, i.e., the second surface 114 of the first substrate 110 may be grinded using a substrate support system (WSS). The structure of FIG. 14 may be turned over, the sealing member 500 may be attached on a carrier substrate C2 using a second adhesive film 22, and then, the second surface 114 of the first substrate 110 may be partially removed until a portion of the first through electrode 150 is exposed.

As illustrated in FIG. 16, processes the same as or similar to the processes described with reference to FIG. 8 may be performed to form a first substrate backside insulation layer 160 on the second surface 114 of the first substrate 110. An opening may be formed in the first substrate backside insulation layer 160 to expose the first through electrode 150. A plating process may be performed. A second bonding pad 170 that is electrically connected to the first through electrode 150 is thereby formed.

Then, one or more solder bumps 600 may be formed on the second bonding pad 170.

In particular, a seed layer may be formed on the second bonding pad 170 of the first substrate backside insulation layer 160. A photoresist pattern having an opening that exposes a portion of the seed layer may be formed on the first substrate backside insulation layer 160.

Then, after filling the opening of the photoresist pattern with a conductive material, the photoresist pattern may be removed and a reflow process may be performed to form the one or more solder bumps 600. For example, the conductive material may be formed on the seed layer by a plating process. Alternatively, the solder bump may be formed by a screen printing process, a vapor deposition process, etc.

Then, the first wafer W1 and the sealing member 500 may be cut along a scribe lane region SA to complete the semiconductor package in FIG. 1.

Figure 17:
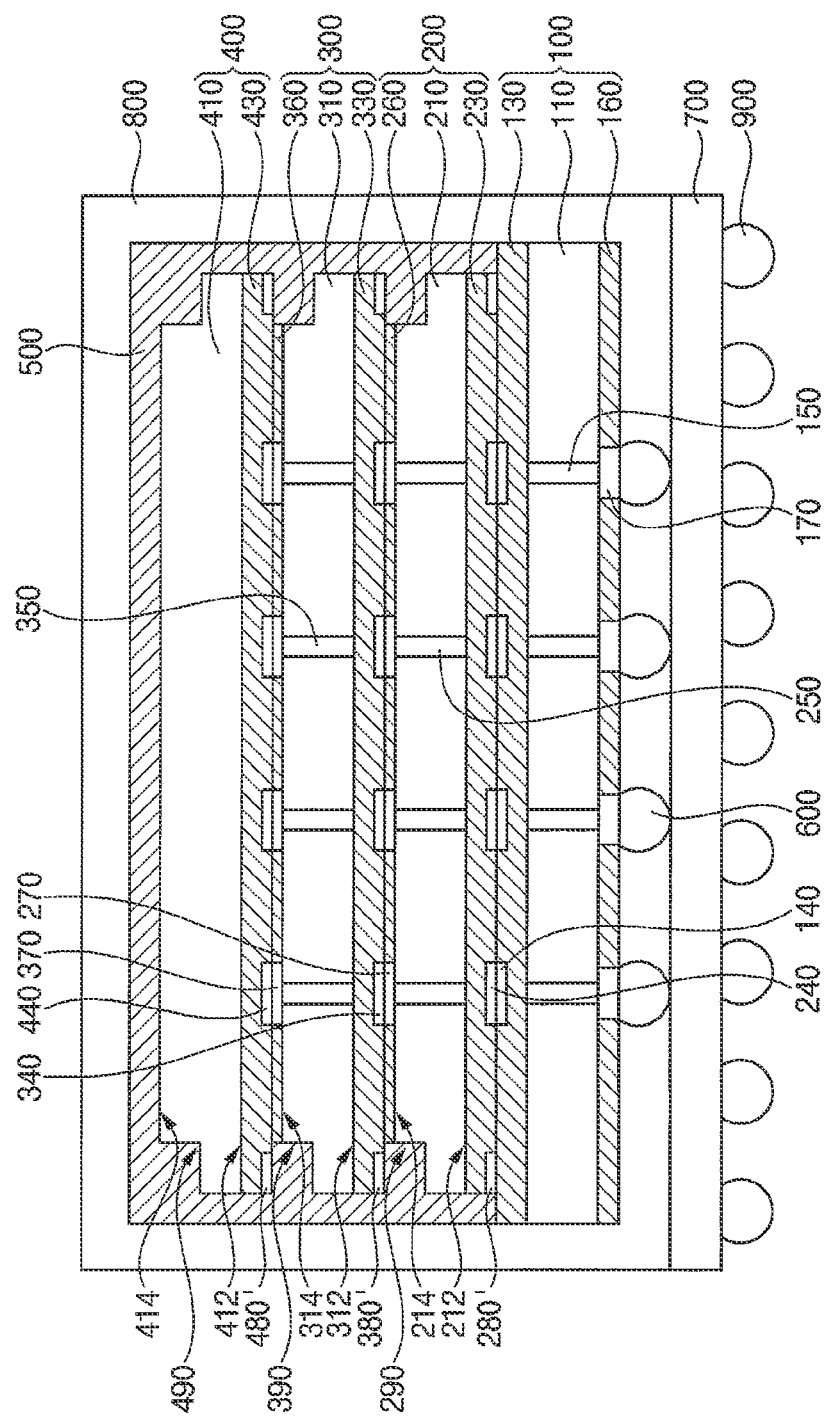

FIG. 17 is a cross-sectional view illustrating a semiconductor package in accordance with example embodiments. The semiconductor package may be substantially the same as or similar to the semiconductor package described with reference to FIG. 1, FIG. 2 and FIG. 3 except for configurations of a package substrate and a molding member. Thus, same reference numerals will be used to refer to the same or like elements and any further repetitive explanation concerning the above elements will be omitted.

Referring to FIG. 17, a semiconductor package 11 may include a package substrate 700, a first semiconductor chip 100, a second semiconductor chip 200, a third semiconductor chip 300, a fourth semiconductor chip 400, and a molding member 800. Additionally, the semiconductor package 11 may further include outer connection terminals 900.

In example embodiments, the package substrate 700 may be a printed circuit board (PCB) including a circuit pattern therein. Substrate pads may be provided on an upper surface of the package substrate 700. The outer connection terminals 900 such as solder balls may be provided on a lower surface of the package substrate 700. Alternatively, the package substrate 700 may be a silicon interposer or a redistribution wiring interposer having a plurality of wirings formed therein.

The first semiconductor chip 100, the second semiconductor chip 200, the third semiconductor chip 300 and the fourth semiconductor chip 400 as described with respect to FIG. 1 may be stacked on the package substrate 700. In this embodiment, it is exemplified that a semiconductor package as a multi-chip package includes four stacked semiconductor chips including the first semiconductor chip 100, the second semiconductor chip 200, the third semiconductor chip 300, and the fourth semiconductor chip 400. However, it will be understood that a semiconductor package as described herein is not limited to this number of stacked semiconductor chips or this configuration of a semiconductor package.

The one or more solder bumps 600 may be conductive bumps interposed between the package substrate 700 and the first semiconductor chip 100. The one or more solder bumps 600 may electrically connect the substrate pad of the package substrate 700 and a second bonding pad 170 of the first semiconductor chip 100.

The molding member 800 may be provided to cover the first semiconductor chip 100, the second semiconductor chip 200, the third semiconductor chip 300, and the fourth semiconductor chip 400 on the package substrate 700. The molding member 800 may include an epoxy molding compound (EMC) material.

Figure 18:
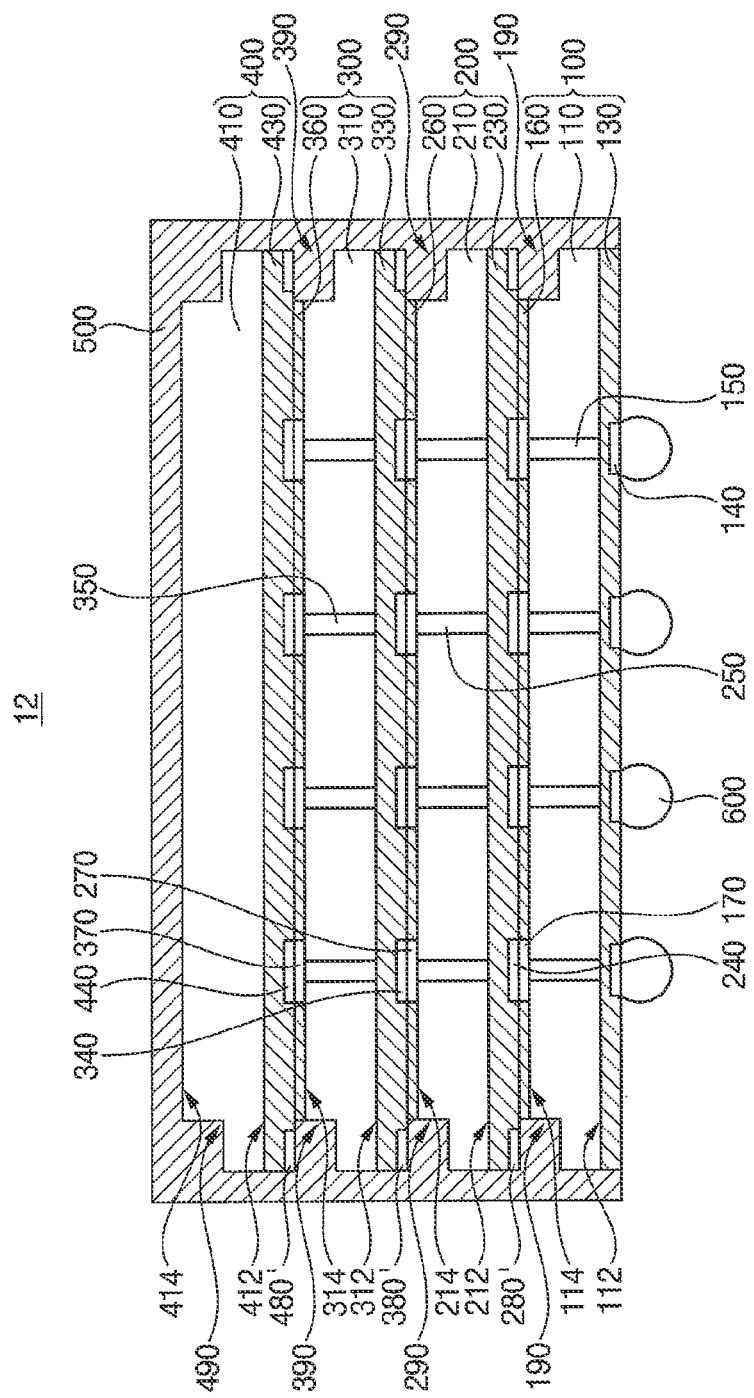

FIG. 18 is a cross-sectional view illustrating a semiconductor package in accordance with example embodiments. The semiconductor package may be substantially the same as or similar to the semiconductor package described with reference to FIG. 1, FIG. 2 and FIG. 3 except for a junction structure of a first semiconductor chip and a second semiconductor chip. Thus, same reference numerals will be used to refer to the same or like elements and any further repetitive explanation concerning the above elements will be omitted.

Referring to FIG. 18, a second semiconductor chip 200 may be arranged on a first semiconductor chip 100 such that a front surface 212 of a second substrate 210 of the second semiconductor chip 200 faces a second surface 114 of a first substrate 110 of the first semiconductor chip 100. A second substrate front insulation layer 230 and a first substrate backside insulation layer 160 may be bonded directly to each other.

Accordingly, a second bonding pad 170 and a third bonding pad 240 may be bonded to each other between the first semiconductor chip 100 and the second semiconductor chip 200 by Cu—Cu Hybrid Bonding.

Although in FIG. 18 the backside surface of the first semiconductor chip 100 and the front surface of the second semiconductor chip 200 are bonded to face each other (back-to-face bonding), the interfacing between the semiconductor chips is not limited thereto. For example, a bonding structure of the second semiconductor chip and the third semiconductor chip and a bonding structure of the third semiconductor chip and the fourth semiconductor chip may also be changed.

Figure 19:
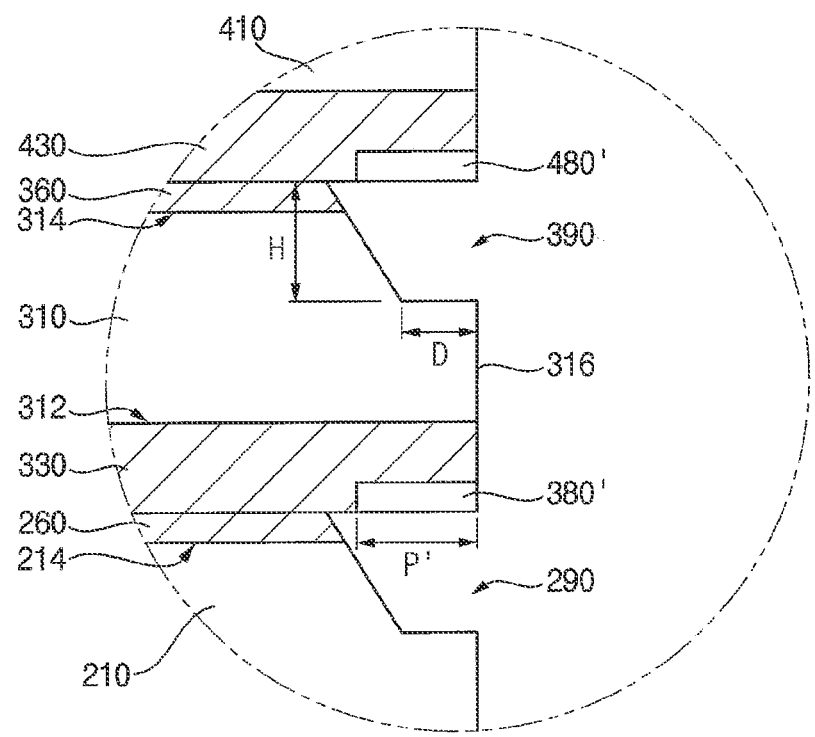
Figure 20:
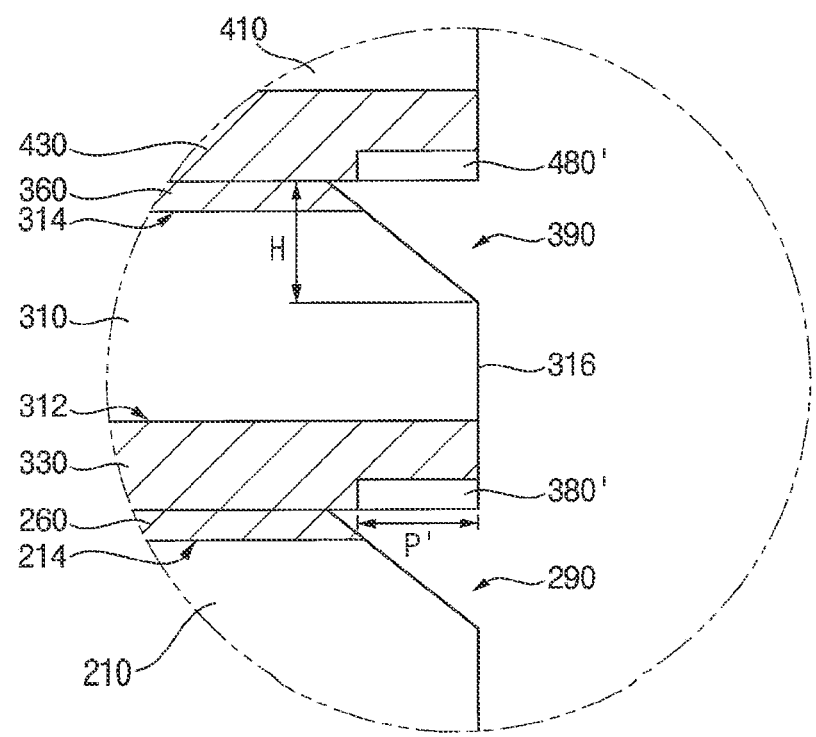

FIG. 19 and FIG. 20 are enlarged cross-sectional views illustrating recesses having various shapes. FIG. 19 and FIG. 20 are enlarged cross-sectional views illustrating portion 'A' in FIG. 1.

Referring to FIG. 19, a sidewall of each of second substrate recess 290 and third substrate recess 390 may extend to be inclined at a predetermined angle with respect to a bottom surface. The angle of the sidewall may have an obtuse angle with respect to the bottom surface.

Referring to FIG. 20, each of second substrate recess 290 and third substrate recess 390 may have a wedge shape formed in four edges of a backside surface of each of second substrate 210 and third substrate 310, respectively. The wedge-shaped recess may have an inclined surface inclined at a predetermined angle with respect to an outer surface of the substrate. The inclined surface may be a flat surface or an arc surface.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present disclosure. Accordingly, all such modifications are intended to be included within the scope of example embodiments as defined in the claims.

What is claimed is:

1. A semiconductor package, comprising:
   a first semiconductor chip;
   a second semiconductor chip stacked on the first semiconductor chip, the second semiconductor chip including
      a second substrate,
      a second substrate front insulation layer on a front surface of the second substrate, and a first bonding pad in an outer surface of the second substrate front insulation layer,
      a second substrate backside insulation layer on a backside surface of the second substrate, and a second bonding pad in an outer surface of the second substrate backside insulation layer,
      a second through electrode penetrating the second substrate and electrically connected to the first bonding pad and the second bonding pad, and
      a second substrate recess formed in an edge of the backside surface of the second substrate;
   a third semiconductor chip stacked on the second semiconductor chip, the third semiconductor chip including
      a third substrate,
      a third substrate front insulation layer on a front surface of the third substrate, and a third bonding pad in an outer surface of the third substrate front insulation layer,
      a third substrate backside insulation layer on a backside surface of the third substrate, and having a fourth bonding pad in an outer surface of the third substrate backside insulation layer,
      a third through electrode penetrating the third substrate and electrically connected to the third bonding pad and the fourth bonding pad, and
      a first metal residual material provided in a peripheral region of the front surface of the third substrate; and
   a fourth semiconductor chip stacked on the third semiconductor chip, the fourth semiconductor chip including
      a fourth substrate and a fourth substrate front insulation layer on a front surface of the fourth substrate, and having a fifth bonding pad in an outer surface of the fourth substrate front insulation layer,
   wherein the second semiconductor chip and the third semiconductor chip are bonded to each other with the front surface of the third substrate and the backside surface of the second substrate facing each other, and the first metal residual material is located in the second substrate recess,
   wherein the front surfaces are active surfaces and the backside surfaces are non-active surfaces, and
   wherein the second bonding pad and the third bonding pad are directly bonded to each other.

2. The semiconductor package of claim 1, wherein the second substrate recess is provided between the backside surface and an outer surface of the second substrate.

3. The semiconductor package of claim 1, wherein the second substrate recess has a stepped shape formed in each of four edges of the backside surface of the second substrate.

4. The semiconductor package of claim 1, wherein a depth of the second substrate recess from the backside surface of the second substrate is within a range of 25 μm to 70 μm, and a width of the second substrate recess from an outer surface of the second substrate is within a range of 10 μm to 20 μm.

5. The semiconductor package of claim 1, wherein a length of the first metal residual material extending along the peripheral region is within a range of 20 μm to 100 μm, and a width of the first metal residual material from an outer surface of the third substrate is within a range of 3 μm to 15 μm.

6. The semiconductor package of claim 1, wherein the second substrate backside insulation layer and the third substrate front insulation layer are directly bonded to each other.

7. The semiconductor package of claim 1, wherein the third semiconductor chip further includes a third substrate recess formed in an edge of the backside surface of the third substrate,
   wherein the fourth semiconductor chip further includes a second metal residual material provided in a peripheral region of the front surface of the fourth substrate, and
   wherein the third semiconductor chip and the fourth semiconductor chip are bonded to each other with the front surface of the fourth substrate and the backside surface of the third substrate facing each other, and the second metal residual material is located in the third substrate recess.

8. The semiconductor package of claim 7, wherein the fourth bonding pad and the fifth bonding pad are directly bonded to each other.

9. The semiconductor package of claim 7, wherein the third substrate backside insulation layer and the fourth substrate front insulation layer are directly bonded to each other.

10. A semiconductor package, comprising:
    a first semiconductor chip, a second semiconductor chip, a third semiconductor chip and a fourth semiconductor chip sequentially stacked on one another,
    wherein the second semiconductor chip includes a second substrate and a second substrate recess formed in an edge of a backside surface of the second substrate,
    wherein the third semiconductor chip includes a third substrate and a first metal residual material provided in a peripheral region of a front surface of the third substrate,
    wherein the second semiconductor chip and the third semiconductor chip are bonded to each other with the front surface of the third substrate and the backside surface of the second substrate facing each other, and the first metal residual material is located in the second substrate recess,
    wherein a first bonding pad on the backside surface of the second substrate and a second bonding pad on the front surface of the third substrate are directly bonded to each other, and
    wherein the front surface of the third substrate is an active surface, and the backside surface of the second substrate is a non-active surface.

11. The semiconductor package of claim 10, wherein the second substrate recess is provided between the backside surface and an outer surface of the second substrate.

12. The semiconductor package of claim 10, wherein the second substrate recess has a stepped shape formed in each of four edges of the backside surface of the second substrate.

13. The semiconductor package of claim 10, wherein a depth of the second substrate recess from the backside surface of the second substrate is within a range of 25 μm to 70 μm, and a width of the second substrate recess from an outer surface of the second substrate is within a range of 10 μm to 20 μm.

14. The semiconductor package of claim 10, wherein a length of the first metal residual material extending along the peripheral region is within a range of 20 μm to 100 μm, and a width of the first metal residual material from an outer surface of the third substrate is within a range of 3 μm to 15 μm.

15. The semiconductor package of claim 10, wherein the second semiconductor chip further includes a second substrate backside insulation layer on the backside surface of the second substrate and having the first bonding pad in an outer surface thereof,
wherein the third semiconductor chip further includes a third substrate front insulation layer on the front surface of the third substrate and having the second bonding pad in an outer surface thereof, and
wherein the second substrate backside insulation layer and the third substrate front insulation layer are directly bonded to each other.

16. The semiconductor package of claim 10, wherein the third semiconductor chip further includes a third substrate recess formed in an edge of a backside surface of the third substrate,
wherein the fourth semiconductor chip further includes a fourth substrate and a second metal residual material provided in a peripheral region of a front surface of the fourth substrate,
wherein the third semiconductor chip and the fourth semiconductor chip are bonded to each other with the front surface of the fourth substrate and the backside surface of the third substrate facing each other, and the second metal residual material is located in the third substrate recess, and
wherein the front surface of the fourth substrate is an active surface, and the backside surface of the third substrate is a non-active surface.

17. The semiconductor package of claim 16, wherein a third bonding pad on the backside surface of the third substrate and a fourth bonding pad on the front surface of the fourth substrate are directly bonded to each other.

18. The semiconductor package of claim 17, wherein the third semiconductor chip further includes a third substrate backside insulation layer on the backside surface of the third substrate and having the third bonding pad in an outer surface thereof,
wherein the fourth semiconductor chip further includes a fourth substrate front insulation layer on the front surface of the fourth substrate and having the fourth bonding pad in an outer surface thereof, and
wherein the third substrate backside insulation layer and the fourth substrate front insulation layer are directly bonded to each other.

19. A semiconductor package, comprising:
a package substrate;
a first semiconductor chip, a second semiconductor chip, a third semiconductor chip and a fourth semiconductor chip sequentially stacked on the package substrate; and
a molding member on the package substrate to cover the first semiconductor chip, the second semiconductor chip, the third semiconductor chip and the fourth semiconductor chip,
wherein the second semiconductor chip includes a second substrate and a second substrate recess formed in an edge of a backside surface of the second substrate,
wherein the third semiconductor chip includes a third substrate and a first metal residual material provided in a peripheral region of a front surface of the third substrate,
wherein the second semiconductor chip and the third semiconductor chip are bonded to each other with the front surface of the third substrate and the backside surface of the second substrate facing each other, and the first metal residual material is located in the second substrate recess,
wherein a first bonding pad on the backside surface of the second substrate and a second bonding pad on the front surface of the third substrate are directly bonded to each other,
wherein a depth of the second substrate recess from the backside surface of the second substrate is within a range of 25 μm to 70 μm, and a width of the second substrate recess from an outer surface of the second substrate is within a range of 10 μm to 20 μm, and
wherein the front surface is an active surface, and the backside surface is a non-active surface.

* * * * *